United States Patent
Banerjee et al.

(10) Patent No.: US 10,714,366 B2
(45) Date of Patent: Jul. 14, 2020

(54) SHAPE METRIC BASED SCORING OF WAFER LOCATIONS

(71) Applicant: KLA-Tencor Corporation, Milpitas, CA (US)

(72) Inventors: Saibal Banerjee, Fremont, CA (US); Jagdish Chandra Saraswatula, Chennai (IN)

(73) Assignee: KLA-Tencor Corp., Milpitas, CA (US)

( * ) Notice: Subject to any disclaimer, the term of this patent is extended or adjusted under 35 U.S.C. 154(b) by 0 days.

(21) Appl. No.: 16/375,851

(22) Filed: Apr. 4, 2019

(65) Prior Publication Data
US 2019/0318949 A1    Oct. 17, 2019

Related U.S. Application Data

(60) Provisional application No. 62/681,066, filed on Jun. 5, 2018.

(51) Int. Cl.
*G03F 7/20* (2006.01)
*H01L 21/67* (2006.01)
(Continued)

(52) U.S. Cl.
CPC ... *H01L 21/67288* (2013.01); *G01N 21/9501* (2013.01); *G01N 21/95607* (2013.01);
(Continued)

(58) Field of Classification Search
CPC .... G03F 7/70641; G03F 1/44; G03F 7/70683; G03F 7/706; G03F 9/7026; G03F 1/84;
(Continued)

(56) References Cited

U.S. PATENT DOCUMENTS 7,570,796 B2    8/2009    Zafar et al.
7,676,077 B2    3/2010    Kulkarni et al.
(Continued)

FOREIGN PATENT DOCUMENTS

JP    2017-152443    8/2017

OTHER PUBLICATIONS

International Search Report and Written Opinion for PCT/US2019/026226 dated Jul. 30, 2019.
(Continued)

*Primary Examiner* — Mesfin T Asfaw
(74) *Attorney, Agent, or Firm* — Ann Marie Mewherter

(57) ABSTRACT

Methods and systems for shape metric based scoring of wafer locations are provided. One method includes selecting shape based grouping (SBG) rules for at least two locations on a wafer. For one of the wafer locations, the selecting step includes modifying distances between geometric primitives in a design for the wafer with metrology data for the one location and determining metrical complexity (MC) scores for SBG rules associated with the geometric primitives in a field of view centered on the one location based on the distances. The selecting step also includes selecting one of the SBG rules for the one location based on the MC scores. The method also includes sorting the at least two locations on the wafer based on the SBG rule selected for the at least two locations.

31 Claims, 7 Drawing Sheets

(51) Int. Cl.
*G01N 21/95* (2006.01)
*H01J 37/22* (2006.01)
*G01N 21/956* (2006.01)
*G06F 30/398* (2020.01)

(52) U.S. Cl.
CPC .......... *G06F 30/398* (2020.01); *H01J 37/226* (2013.01); *H01L 21/67271* (2013.01)

(58) Field of Classification Search
CPC .............. G03F 7/70433; G03F 7/7085; H04N 5/23212; G02B 21/241; G02B 26/128; G02B 27/62; G02B 7/04; G03B 13/32; G03B 13/36; G06T 7/13
See application file for complete search history.

(56) References Cited

U.S. PATENT DOCUMENTS

| | | |
|---|---|---|
| 8,126,255 B2 | 2/2012 | Bhaskar et al. |
| 8,664,594 B1 | 4/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |
| 9,222,895 B2 | 12/2015 | Duffy et al. |
| 2014/0114597 A1 | 4/2014 | Chen et al. |
| 2015/0067618 A1 | 3/2015 | Robles |
| 2015/0234379 A1 | 8/2015 | Vajaria et al. |
| 2016/0116420 A1 | 4/2016 | Duffy et al. |
| 2017/0186151 A1* | 6/2017 | Banerjee ............... G06T 7/0006 |
| 2017/0244936 A1 | 8/2017 | Koga et al. |

OTHER PUBLICATIONS

Hand et al., "Principles of Data Mining (Adaptive Computation and Machine Learning)," MIT Press, Aug. 1, 2001, 578 pages.
Jebara, "Discriminative, Generative, and Imitative Learning," MIT Thesis, Feb. 2002, 212 pages.
Shin, Chapter 2 of "Variation-Aware Advanced CMOS Devices and SRAM," Springer Netherlands, 2016, pp. 19-35.
Sugiyama, "Introduction to Statistical Machine Learning," Morgan Kaufmann, Oct. 9, 2015, 534 pages.
U.S. Appl. No. 15/903,841 by Saraswatula et al. filed Feb. 23, 2018 (submitted as U.S. Patent Application Publication 2019/0072858 published Mar. 7, 2019).
U.S. Appl. No. 16/113,930 by Plihal et al. filed Aug. 27, 2018 (submitted as U.S. Patent Application Publication No. 2019/0067060 published Feb. 28, 2019).

* cited by examiner

SHAPE METRIC BASED SCORING OF WAFER LOCATIONS

BACKGROUND OF THE INVENTION

1. Field of the Invention

This invention generally relates to methods and systems for shape metric based scoring of wafer locations.

2. Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

"Care areas" as they are commonly referred to in the art are areas on a specimen that are of interest for inspection purposes. Sometimes, care areas are used to differentiate areas on the specimen that are inspected from areas on the specimen that are not inspected in an inspection process. In addition, care areas are sometimes used to differentiate between areas on the specimen that are to be inspected with one or more different parameters. For example, if a first area of a specimen is more critical than a second area on the specimen, the first area may be inspected with a higher sensitivity than the second area so that defects are detected in the first area with a higher sensitivity. Other parameters of an inspection process can be altered from care area to care area in a similar manner.

Different categories of inspection care areas are currently used. One category is legacy care areas, which are traditionally hand drawn. With nearly most users adopting design guided inspection, very few legacy care areas are currently used. Another category is design based care areas. These are care areas derived based on heuristics on chip design patterns printed on the specimen. There are multiple techniques and tools available to define these design based care areas. As they are derived from ground truth (chip design), they end up providing high precision, tiny care areas and also allow inspection systems to store high volumes of care areas. These care areas are important not just from a defect detection standpoint, but are often crucial to noise suppression.

It may not always be straightforward to identify or select care areas on a specimen for inspection purposes. For example, the process for generating care areas may include running a substantially hot inspection, i.e., an inspection with an abnormally low threshold. The events detected by such an inspection may then be grouped based on design for the specimen proximate the events. Since the inspection is run substantially hot, the detected events are more or less entirely nuisance. Therefore, based on the results of the design based grouping of the detected events, the portions of the design that generated the most frequently detected nuisance events may be identified. New care areas that contain these "nuisance generating" patterns may be created. It can however be difficult and/or time consuming to create these. The steps described above may be repeated until care areas are sufficiently generated.

Defect review typically involves re-detecting defects detected as such by an inspection process and generating additional information about the defects at a higher resolution using either a high magnification optical system or a scanning electron microscope (SEM). Defect review is therefore performed at discrete locations on the wafer where defects have been detected by inspection. The higher resolution data for the defects generated by defect review is more suitable for determining attributes of the defects such as profile, roughness, more accurate size information, etc.

Metrology processes are also used at various steps during a semiconductor manufacturing process to monitor and control the process. Metrology processes are different than inspection processes in that, unlike inspection processes in which defects are detected on a wafer, metrology processes are used to measure one or more characteristics of the wafer that cannot be determined using currently used inspection tools. For example, metrology processes are used to measure one or more characteristics of a wafer such as a dimension (e.g., line width, thickness, etc.) of features formed on the wafer during a process such that the performance of the process can be determined from the one or more characteristics. In addition, if the one or more characteristics of the wafer are unacceptable (e.g., out of a predetermined range for the characteristic(s)), the measurements of the one or more characteristics of the wafer may be used to alter one or more parameters of the process such that additional wafers manufactured by the process have acceptable characteristic(s).

Metrology processes are also different than defect review processes in that, unlike defect review processes in which defects that are detected by inspection are re-visited in defect review, metrology processes may be performed at locations at which no defect has been detected. In other words, unlike defect review, the locations at which a metrology process is performed on a wafer may be independent of the results of an inspection process performed on the wafer. In particular, the locations at which a metrology process is performed may be selected independently of inspection results. In addition, since locations on the wafer at which metrology is performed may be selected independently of inspection results, unlike defect review in which the locations on the wafer at which defect review is to be performed cannot be determined until the inspection results for the wafer are generated and available for use, the locations at which the metrology process is performed may be determined before an inspection process has been performed on the wafer.

Huge benefits are provided by using design information to generate care areas and sample defects for review. One such advantage is that inspections can be tailored to areas in the design that the user cares about. Another advantage is that defects can be sampled based on the design so that additional information about defects that are particularly relevant to the fabrication of the design on the wafer can be prioritized. In one such example, defects can be sampled based on the patterned features they are proximate to so that defects located in or near high priority patterns can be sampled more heavily than other defects.

There are, however, a number of disadvantages for the currently used methods and systems for generating care areas and sampling defects for review or other processes (e.g., metrology, etc.). For example, generating care areas and sampling defects based on design, in of itself, does not necessarily take into consideration how the design is actually formed on the wafer. For example, the design as formed on the wafer will vary from the design as created in the design process (i.e., the design intent). If the design is formed on the wafer with different characteristics (e.g., dimensions, location of some patterned features relative to other patterned features, shape, etc.) than designed, those different characteristics can change the complexity or priority of the patterns (and hence the defects) on the wafer. Therefore, if the care area generation and defect sampling processes do not take such differences into consideration, the care areas and defect samples may not adequately reflect the as-formed complexities and/or priorities of the patterns and defects on the wafers. In addition, such variations in the characteristics of patterned features as designed compared to the patterned features as formed may not necessarily be predictable. For example, simulations of how the design will be formed on the wafer may not be able to accurately predict changes in the design as formed due to across wafer variations, random variations, changes in process conditions, etc. Therefore, even if currently used methods and systems generate care areas or defect sampling schemes based on a design and/or how the design is expected to be formed on a wafer, those methods and systems may still not be based on the actual complexities and/or priorities of the patterned features formed on the wafer.

Accordingly, it would be advantageous to develop systems and/or methods for shape metric based sorting of wafer locations that do not have one or more of the disadvantages described above.

SUMMARY OF THE INVENTION

The following description of various embodiments is not to be construed in any way as limiting the subject matter of the appended claims.

One embodiment relates to a system configured for shape metric based sorting of wafer locations. The system includes one or more computer subsystems configured for selecting shape based grouping (SBG) rules for at least two locations on a wafer. For one of the locations on the wafer, selecting the SBG rule includes determining distances between geometric primitives in a field of view (FOV) centered on the one location by modifying distances between the geometric primitives in a design for the wafer with metrology data for the one location on the wafer. Selecting the SBG rule for the one location also includes determining metrical complexity (MC) scores for SBG rules associated with the geometric primitives in the FOV based on the determined distances between the geometric primitives. In addition, selecting the SBG rule for the one location includes selecting one of the SBG rules for the one location based on the MC scores. The one or more computer subsystems are also configured for sorting the at least two locations on the wafer based on the SBG rules selected for the at least two locations. The system may be further configured as described herein.

Another embodiment relates to a computer-implemented method for shape metric based sorting of wafer locations. The method includes the selecting SBG rules and sorting steps described above. The steps of the method are performed by one or more computer subsystems. Each of the steps of the method described above may be further performed as described further herein. In addition, the method described above may include any other step(s) of any other method(s) described herein. Furthermore, the method described above may be performed by any of the systems described herein.

An additional embodiment relates to a non-transitory computer-readable medium storing program instructions executable on a computer system for performing a computer-implemented method for shape metric based sorting of wafer locations. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

Figure 1:
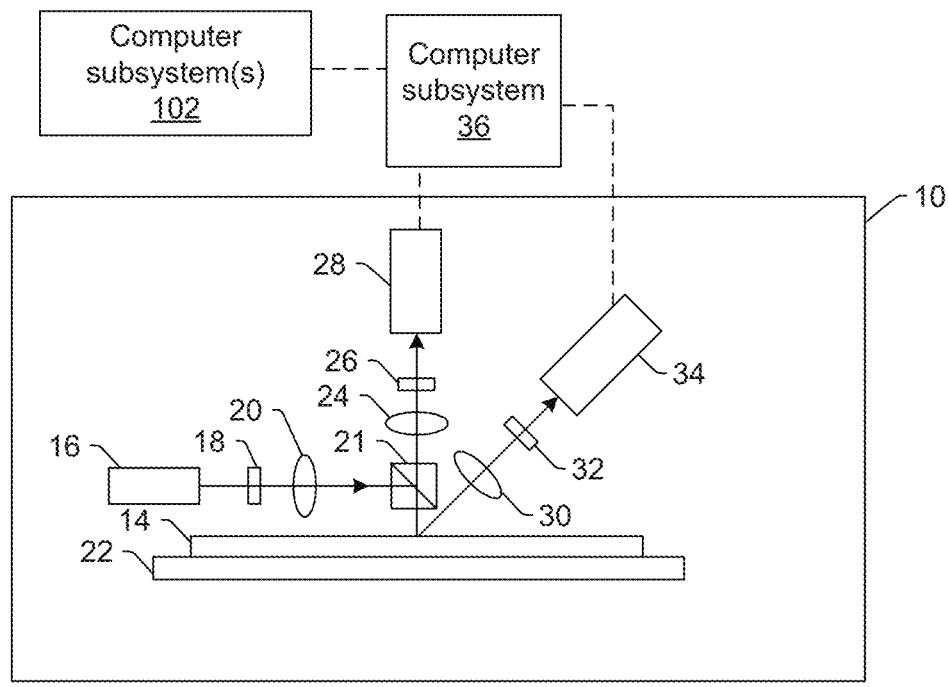
FIGS. 1 and 2 are schematic diagrams illustrating a side view of an embodiment of a system configured as described herein.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design" and "design data" as used herein generally refer to the physical design (layout) of an IC and data derived from the physical design through complex simulation or simple geometric and Boolean operations. The physical design may be stored in a data structure such as a graphical data stream (GDS) file, any other standard machine-readable file, any other suitable file known in the art, and a design database. A GDSII file is one of a class of files used for the representation of design layout data. Other examples of such files include GL1 and OASIS files and proprietary file formats such as RDF data, which is proprietary to KLA-Tencor, Milpitas, Calif. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. Nos. 7,570,796 issued on Aug. 4, 2009 to Zafar et al. and 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In some instances, simulated or acquired images from a wafer or reticle can be used as a proxy for the design. Image analysis can also be used as a proxy for design data. For example, polygons in the design may be extracted from an image of a design printed on a wafer and/or reticle, assuming that the image of the wafer and/or reticle is acquired with sufficient resolution to adequately image the polygons of the design. In addition, the "design" and "design data" described herein refers to information and data that is generated by semiconductor device designers in a design process and is therefore available for use in the embodiments described herein well in advance of printing of the design on any physical wafers, The "design" or "physical design" may also be the design as it would be ideally formed on the wafer. In this manner, a design described herein may not include features of the design that would not be printed on the wafer such as optical proximity correction (OPC) features, which are added to the design to enhance printing of the features on the wafer without actually being printed themselves.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured for shape metric based sorting of wafer locations. Shape based grouping (SBG) rules encapsulate prior knowledge of hot spots at wafer locations due to design pattern influence at those locations. These rules, expressed as spatial co-occurrence of and spatial relations between geometric primitives, have proven to be an important source of information in understanding systematic defect formation. SBG has at least two major use cases as described further herein: defining prioritized micro-care areas for inspection; and prioritizing samples for review.

The embodiments described herein enhance the complexity scores of SBG rules, by augmenting them with design metrics and metrology measurements, which provides a number of advantages including providing the ability to achieve more finely tuned hot spot criticality scores. The study of defect sampling improvements using metrology measurements and the remarkable efficacy of using SBG scores for process window qualification (PWQ) sampling lead the inventors to the novel understanding that the union of these two, i.e., SBG combined with metrology measurements and design metrics, will produce a superior sampling method compared to existing ones. Furthermore, such a superior sampling method can provide an "out-of-the-box" sampling method that advantageously requires little or no training.

One embodiment of such a system is shown in FIG. 1. In one embodiment, the system includes an output acquisition subsystem that includes at least an energy source and a detector. The energy source is configured to generate energy that is directed to a wafer. The detector is configured to detect energy from the wafer and to generate output responsive to the detected energy. The wafer may include any wafer known in the art.

In one embodiment, the energy directed to the wafer includes light, and the energy detected from the wafer includes light. For example, in the embodiment of the system shown in FIG. 1, output acquisition subsystem 10 includes an illumination subsystem configured to direct light to wafer 14. The illumination subsystem includes at least one light source. For example, as shown in FIG. 1, the illumination subsystem includes light source 16. In one embodiment, the illumination subsystem is configured to direct the light to the wafer at one or more angles of incidence, which may include one or more oblique angles and/or one or more normal angles. For example, as shown in FIG. 1, light from light source 16 is directed through optical element 18 and then lens 20 to beam splitter 21, which directs the light to wafer 14 at a normal angle of incidence. The angle of incidence may include any suitable angle of incidence, which may vary depending on, for instance, characteristics of the wafer.

The illumination subsystem may be configured to direct the light to the wafer at different angles of incidence at different times. For example, the output acquisition subsystem may be configured to alter one or more characteristics of one or more elements of the illumination subsystem such that the light can be directed to the wafer at an angle of incidence that is different than that shown in FIG. 1. In one such example, the output acquisition subsystem may be configured to move light source 16, optical element 18, and lens 20 such that the light is directed to the wafer at a different angle of incidence.

In some instances, the output acquisition subsystem may be configured to direct light to the wafer at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the wafer at the same time as the other light, one or more characteristics (e.g., wavelength, polarization, etc.) of the light directed to the wafer at different angles of incidence may be different such that light resulting from illumination of the wafer at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the wafer. Multiple illumination channels may be configured to direct light to the wafer at the same time or at different times (e.g., when different illumination channels are used to sequentially illuminate the wafer). In another instance, the same illumination channel may be configured to direct light to the wafer with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the wafer at different times. The illumination subsystem may have any other suitable configuration known in the art for directing light having different or the same characteristics to the wafer at different or the same angles of incidence sequentially or simultaneously.

In one embodiment, light source 16 is a broadband plasma (BBP) light source. In this manner, the light generated by the light source and directed to the wafer may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to beam splitter 21 by lens 20. Although lens 20 is shown in FIG. 1 as a single refractive optical element, it is to be understood that, in practice, lens 20 may include a number of refractive and/or reflective optical elements that in combination focus the light from the optical element to the wafer. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for the wafer.

The output acquisition subsystem may also include a scanning subsystem configured to cause the light to be scanned over the wafer. For example, the output acquisition subsystem may include stage 22 on which wafer 14 is disposed during output acquisition. The scanning subsystem may include any suitable mechanical and/or robotic assembly (that includes stage 22) that can be configured to move the wafer such that the light can be scanned over the wafer. In addition, or alternatively, the output acquisition subsystem may be configured such that one or more optical elements of the output acquisition subsystem perform some scanning of the light over the wafer. The light may be scanned over the wafer in any suitable fashion.

The output acquisition subsystem further includes one or more detection channels, At least one of the one or more detection channels includes a detector configured to detect light from the wafer due to illumination of the wafer by the output acquisition subsystem and to generate output responsive to the detected light. For example, the output acquisition subsystem shown in FIG. 1 includes two detection channels, one formed by collector 24, element 26, and detector 28 and another thrmed by collector 30, element 32, and detector 34. As shown in FIG. 1, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the wafer. However, two or more of the detection channels may be configured to detect the same type of light from the wafer (e.g., specularly reflected light). Although FIG. 1 shows an embodiment of the output acquisition subsystem that includes two detection channels, the output acquisition subsystem may include a different number of detection channels (e.g., only one detection channel or two or more detection channels). Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the output acquisition subsystem may be signals or data, but not image signals or image data. In such instances, a computer subsystem such as computer subsystem 36 of the system may be configured to generate images of the wafer from the non-imaging output of the detectors. However, in other instances, the detectors may be configured as imaging detectors that are configured to generate imaging signals or image data. Therefore, the system may be configured to generate the output described herein in a number of ways.

It is noted that FIG. 1 is provided herein to generally illustrate a configuration of an output acquisition subsystem that may be included in the system embodiments described herein. Obviously, the output acquisition subsystem configuration described herein may be altered to optimize the performance of the system as is normally performed when designing a commercial system. In addition, the systems described herein may be implemented using an existing output acquisition system (e.g., by adding functionality described herein to an existing system) such as the 29*xx*, 39*xx*, Archer, ATL, SpectraShape, SpectraFilm, Aleris, and WaferSight series of tools that are commercially available from KLA-Tencor, Milpitas, Calif. For some such systems, the methods described herein may be provided as optional functionality of the system (e.g., in addition to other functionality of the system). Alternatively, the system described herein may be designed "from scratch" to provide a completely new system.

Computer subsystem 36 of the system may be coupled to the detectors of the output acquisition subsystem in any suitable manner (e.g., via one or more transmission media, which may include "wired" and/or "wireless" transmission media) such that the computer subsystem can receive the output generated by the detectors during scanning of the wafer. Computer subsystem 36 may be configured to perform a number of functions using the output of the detectors as described herein and any other functions described further herein. For example, in one embodiment, the one or more computer subsystems included in the system are configured to determine information for at least two locations on the wafer based on the output.

The information determined by the computer subsystem(s) may vary depending on the configuration of the output acquisition subsystem. For example, if the output acquisition subsystem is configured as an inspection subsystem, then the information may include information for defects detected on the wafer using the output. In one such example, the computer subsystem(s) are configured for detecting defects on the wafer by applying a defect detection method to the output. Detecting defects on the wafer may be performed in any suitable manner known in the art (e.g., applying a defect detection threshold to the output and determining that any output having a value above the defect detection threshold corresponds to a defect or a potential defect) with any suitable defect detection method and/or algorithm. In another example, if the output acquisition subsystem is configured as a metrology subsystem, then the information may include information for one or more characteristics of the wafer or features formed on the wafer such as one or more of film thickness, patterned structure profile, critical dimension (CD), line edge roughness (LER), line width roughness (LWR), and overlay measurements. These one or more characteristics may be determined using the output as described further herein or in any other manner known in the art. In an additional example, if the output acquisition subsystem is configured as a defect review subsystem, then the information for the locations may be information for defects at the locations generated by defect review. That information may include one or more characteristics of the defects such as size, shape, texture, etc. and/or defect classification information such as a defect type ID. The defect information may be determined as described further herein or in any other manner known in the art. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

Figure 2:
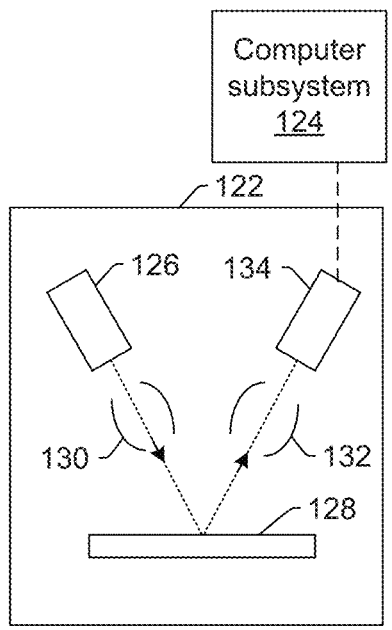

In another embodiment, the energy directed to the wafer includes electrons and the energy detected from the wafer includes electrons. In this manner, the output acquisition subsystem is configured as an electron beam output acquisition subsystem. In one such embodiment shown in FIG. 2, the output acquisition subsystem includes electron column 122, which is coupled to computer subsystem 124. As also shown in FIG. 2, the electron column includes electron beam source 126 configured to generate electrons that are focused to wafer 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the wafer (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. Nos. 8,664,594 issued Apr. 4, 2014 to Jiang et al., 8,692,204 issued Apr. 8, 2014 to Kojima et al., 8,698,093 issued Apr. 15, 2014 to Gubbens et al., and 8,716,662 issued May 6, 2014 to MacDonald et al., which are incorporated by reference as if fully set forth herein.

Although the electron column is shown in FIG. 2 as being configured such that the electrons are directed to the wafer at an oblique angle of incidence and are scattered from the wafer at another oblique angle, it is to be understood that the electron beam may be directed to and scattered from the wafer at any suitable angles. In addition, the electron beam subsystem may be configured to use multiple modes to generate images of the wafer (e.g., with different illumination angles, collection angles, etc.). The multiple modes of the electron beam subsystem may be different in any image generation parameters of the subsystem.

Computer subsystem 124 may be coupled to detector 134 as described above. The detector may detect electrons returned from the surface of the wafer thereby forming electron beam images of the wafer. The electron beam images may include any suitable electron beam images. Computer subsystem 124 may be configured to perform any of the functions described herein using the output of the detector and/or the electron beam images. Computer subsystem 124 may be configured to perform any additional step(s) described herein. A system that includes the electron beam subsystem shown in FIG. 2 may be further configured as described herein.

It is noted that FIG. 2 is provided herein to generally illustrate a configuration of an output acquisition subsystem that may be included in the embodiments described herein. As with the optical subsystem described above, the electron beam subsystem described herein may be altered to optimize the performance of the electron beam subsystem as is normally performed when designing a commercial system. In addition, the systems described herein may be implemented using an existing electron beam system (e.g., by adding functionality described herein to an existing electron beam system). For some such systems, the methods described herein may be provided as optional functionality of the system (e.g., in addition to other functionality of the system). Alternatively, the system described herein may be designed "from scratch" to provide a completely new system.

Although the output acquisition subsystem is described above as being an optical or electron beam subsystem, the output acquisition subsystem may be an ion beam subsystem. Such an output acquisition subsystem may be configured as shown in FIG. 2 except that the electron beam source may be replaced with any suitable ion beam source known in the art. In addition, the output acquisition subsystem may be any other suitable ion beam tool such as those included in commercially available focused ion beam (FIB) systems, helium ion microscopy (HIM) systems, and secondary ion mass spectroscopy (SIMS) systems.

As noted above, the output acquisition subsystem may be configured for directing energy (e.g., light, electrons) to and/or scanning energy over a physical version of the wafer thereby generating actual (i.e., not simulated) output and/or images for the physical version of the wafer. In this manner, the output acquisition subsystem may be configured as an "actual" tool, rather than a "virtual" tool. Computer subsystem(s) 102 shown in FIG. 1 may, however, include one or more "virtual" systems (not shown) that are configured for performing one or more functions using at least some of the actual output or images generated for the water, which may include any of the one or more functions described further herein.

The one or more virtual systems are not capable of having the wafer disposed therein. In particular, the virtual system(s) are not park of output acquisition subsystem 10 or electron column 122 and do not have any capability for handling the physical version of the wafer. In other words, in a virtual system, the output of its one or more "detectors" may be output that was previously generated by one or more detectors of an actual subsystem and that is stored in the virtual system, and during the "imaging and/or scanning," the virtual system may replay the stored output as though the wafer is being imaged and/or scanned. In this manner, imaging and/or scanning the wafer with a virtual system may appear to be the same as though a physical water is being imaged and/or scanned with an actual system, while, in reality, the "imaging and/or scanning" involves simply replaying output for the wafer in the same manner as the wafer may be imaged and/or scanned.

Systems and methods configured as "virtual" inspection systems are described in commonly assigned U.S. Pat. Nos. 8,126,255 issued on Feb. 28, 2012 to Bhaskar et al. and 9,222,895 issued on Dec. 29, 2015 to Duffy et al., both of which are incorporated by reference as if fully set forth herein. The embodiments described herein may be further configured as described in these patents. For example, the one or more computer subsystems described herein may be further configured as described in these patents.

The output acquisition subsystems described herein may be configured to generate output, e.g., images, of the wafer with multiple modes. In general, a "mode" is defined by the values of parameters of the output acquisition subsystem used for generating images of a wafer or the output used to generate images of the wafer. Therefore, modes that are different may be different in the values for at least one of the parameters of the output acquisition subsystem. In this manner, in some embodiments, the output includes images generated by the output acquisition subsystem with two or more different values of a parameter of the output acquisition subsystem. For example, in one embodiment of an optical subsystem, different modes may use different wavelengths of light for illumination. The modes may be different in the illumination wavelengths as described further herein (e.g., by using different light sources, different spectral filters, etc.) for different modes. In another embodiment, different modes may use different illumination channels. For example, as noted above, the output acquisition subsystem may include more than one illumination channel. As such, different illumination channels may be used for different modes.

In a similar manner, the output generated by the electron beam subsystem may include output, e.g., images, generated by the electron beam subsystem with two or more different values of a parameter of the electron beam subsystem. The multiple modes of the electron beam subsystem can be defined by the values of parameters of the electron beam subsystem used for generating output and/or images for a wafer. Therefore, modes that are different may be different in the values for at least one of the electron beam parameters of the electron beam subsystem. For example, in an electron beam subsystem, different modes may use different angles of incidence for illumination.

The one or more computer subsystems are configured for selecting SBG rules for at least two locations on a wafer. In other words, for each location on the wafer for which the steps described herein are performed, the computer subsystem(s) may select one SBG rule (i.e., one SBG rule per location under consideration). Although some of the steps are described herein as being performed for one location for the sake of simplicity, each of the steps described herein may be performed separately and independently for each of the locations for which SBG rules are being selected.

In one embodiment, the at least two locations on the wafer include locations of defects detected on the wafer by inspection. The locations of the defects detected on the wafer may be determined by the embodiments described herein (e.g., by the computer subsystem(s) coupled to the output acquisition subsystems described herein) or by another system that performs inspection of the wafer. The locations may be determined in any suitable manner. The steps described herein may be performed for defect locations if, for example, the steps are performed to generate a sampling scheme for the defects and/or to generate a sample of the defects. In another embodiment, the at least two locations include SBG rule hit locations. The SBG rule hit locations may be determined as described herein by the embodiments described herein or by another system or method. The steps described herein may be performed for SBG rule hit locations if, for example, the steps are performed to generate care areas for the wafer.

For one of the locations on the wafer, selecting the SBG rule includes determining distances between geometric primitives in a field of view (FOV) centered on the one location by modifying distances between the geometric primitives in a design for the wafer with metrology data for the one location on the wafer. The term "geometric primitive" as used herein (and commonly used in the art) is defined as at least a portion of a patterned feature that is or will be formed on a specimen such as a wafer. In one such example, a patterned feature that is or will be formed on a wafer may be defined by or broken up into the geometric primitives that define it as a feature. Some examples of geometric primitives are described further herein for illustrative purposes, while also noting that the embodiments described herein are not limited to these or any geometric primitives.

The FOV may have predetermined dimensions such as those described further herein. The FOV may or may not be different than a FOV of a metrology, inspection, defect review, or other tool that performs an imaging or measurement process on a wafer. For example, the FOV may have dimensions in the design or on the wafer that correspond to the dimensions of a FOV of an inspection tool on the wafer. However, the FOV may have dimensions in the design or on the wafer that are determined based on knowledge of the design itself, e.g., its design rule or dimensions of one or more patterned features in the design (so that the FOV is large enough to capture a suitable number of patterned features at or near the location), information for how the measurements or images generated for the location will be processed (e.g., information for how many pixels are in a "job" performed for the location in which all of the pixels are collectively processed for inspection, defect review, metrology, etc.), and the like.

As described further herein, geometric primitives may have different characteristics as formed on a wafer compared to as designed in the design data for the wafer. The characteristics of the geometric primitives as they are formed on the wafer cannot be determined simply from design data. Instead, the embodiments described herein use metrology data for modifying such characteristics including the distances between geometric primitives in the FOV. The distances between the geometric primitives are determined in the embodiments described herein because they can have an effect on the metrical complexity (MC) of the SBG rules determined as described herein. Therefore, to determine the MC scores of the SBG rules with relatively high accuracy, it is important to take into account any variation in distance between the geometric primitives on the wafer compared to in the design for the wafer.

As described further herein, the metrology data for the one location on the wafer that is used to determine the distances between the geometric primitives in the FOV centered on the one location may not be metrology data generated at that location by a metrology tool. For example, unlike the case in which local design dimensions can be measured directly and easily through design data, the local design dimensions on a wafer may be estimated (or predicted, e.g., through interpolation) based on metrology data generated at certain predetermined metrology target points on the wafer (having specific patterns) that may or may not be substantially close to the actual location. However, using the embodiments described herein, in the case of a CD estimation process, the computer subsystem(s) could determine the changes (e.g., dilation or erosion) of each polygon at any wafer location (measured or not) and apply these geometric transformations to the design at that location. Similarly, after an overlay estimation process, the shifts of each pattern (or any patterns) printed on the wafer with a different mask in the +/−x and +/−y directions can be estimated (i.e., predicted, e.g., via interpolation) at every wafer location (measured or not), and the computer subsystem(s) can overlay correct the design at each of those locations with these shift estimates.

In one embodiment, the computer subsystem(s) are configured for acquiring the metrology data for the wafer from a metrology tool that performs measurements on the wafer at an array of measurement points on the wafer and assigning the metrology data to the at least two locations on the wafer based on positions of the at least two locations on the wafer determined with respect to locations of the measurement points on the wafer. Metrology and inspection are generally treated as separate domains in semiconductor manufacturing. For example, metrology is typically calibrated to a reference standard, and inspection is typically performed by comparing acquired signal results (output, signals, images, etc.) from proximate structures (e.g., within die, die-to-die, etc.) or versus a stored reference (recorded or generated through simulation or otherwise synthesized).

The metrology tool may have any suitable configuration known in the art. In one example, the output acquisition subsystems shown in FIGS. 1 and 2 may be configured and used as metrology subsystems. In particular, the embodiments of the output acquisition subsystems described herein and shown in FIGS. 1 and 2 may be modified in one or more parameters to provide different capability depending on the application for which they will be used. In one such example, the output acquisition subsystems shown in FIGS. 1 and 2 may be configured to have a higher resolution if they are to be used for metrology rather than for inspection. In other words, the embodiments of the output acquisition subsystems shown in FIGS. 1 and 2 illustrate some general and various configurations that can be tailored in a number of manners that will be obvious to one skilled in the art to produce subsystems having different capabilities that are more or less suitable for different applications such as inspection and/or metrology. In addition, if the same subsystem has variable hardware settings such that it can be used for multiple applications (e.g., both inspection and metrology), then the same subsystem can be used for both inspection and metrology. In a similar manner, the output acquisition subsystems shown in FIGS. 1 and 2 may be configured as defect review subsystems.

An output acquisition subsystem configured for inspection will, however, generally be configured to have a resolution lower than the resolution of a metrology tool during a metrology process (or a defect review tool during a defect review process). For example, even if the output acquisition subsystems described herein are configurable to have relatively high resolutions that would render them suitable for metrology (or defect review), during an inspection process, the output acquisition subsystem would be configured for a lower resolution to improve the throughput of the inspection process (especially since such a high resolution is not typically necessary or required for the inspection processes described herein).

Figure 3:
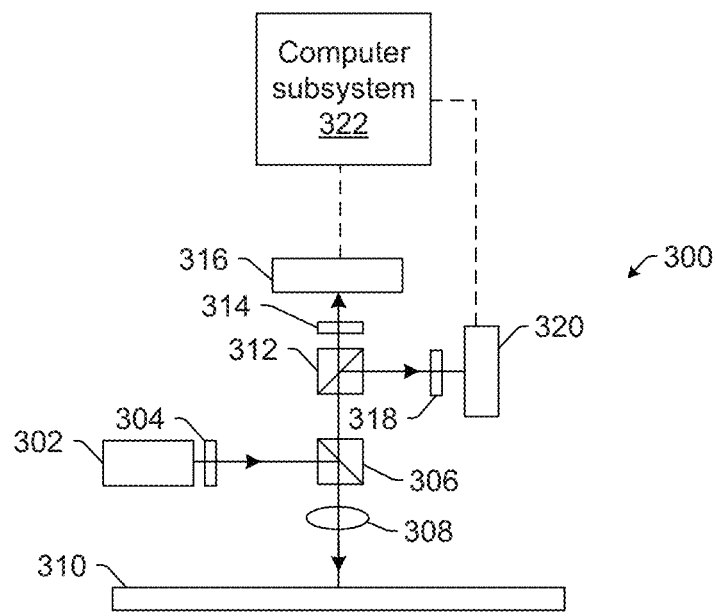
FIG. 3 is a schematic diagram illustrating a side view of an embodiment of a metrology tool configured as described herein.

FIG. 3, however, shows another embodiment of a metrology tool that may perform measurements on the wafer as described herein. In the case of an optical metrology tool, the metrology tool may include an illumination subsystem configured to direct light having one or more illumination wavelengths to a wafer. For example, in the metrology tool embodiment shown in FIG. 3, the illumination subsystem of metrology tool 300 includes light source 302, which may include any of the light sources described herein. Light generated by light source 302 may be directed through one or more spectral filters 304 of the illumination subsystem. Spectral filter(s) 304 may be configured as described further herein. The illumination subsystem may also include beamsplitter 306 that is configured to reflect light from the spectral filter(s) to objective 308 of the illumination subsystem. Beamsplitter 306 and objective 308 may be further configured as described herein. Objective 308 is configured to focus light having the one or more illumination wavelengths from the beamslitter to wafer 310, which may include any of the wafers described herein.

In one embodiment, the illumination subsystem includes a broadband light source. For example, light source 302 shown in FIG. 3 may be a broadband light source, and one or more spectral filters 304 may be positioned in a path of light from the broadband light source. Therefore, the metrology tool may include a broadband source with a selectable wavelength range for illumination through wavelength dependent filters. For example, the wavelength(s) directed to the wafer may be altered by changing or removing the spectral filter(s) positioned in the path of the light from the light source. In this manner, the metrology tool may be configured to have flexible illumination wavelength(s) that can be varied depending on the materials on the wafer.

The metrology tool may also incorporate narrower or modified bandpass filters into the illumination subsystem. In one such embodiment, the one or more spectral filters include one or more interference filters. For example, spectral filter(s) 304 may be interference filter(s). In this manner, the metrology tool may include a broadband source with a selectable wavelength range for illumination through interference filters. These filters can complement or replace bandpass filters currently being used in tools.

In additional embodiments, the illumination subsystem includes one or more narrowband light sources or one or more laser light sources. The narrowband and/or laser light sources may include any suitable such light sources such as one or more diode lasers, diode-pumped solid state (DPSS) lasers, gas lasers, etc. In addition, the illumination subsystems described herein may include any number of broadband, narrowband, and laser light sources in any suitable combination. Furthermore, the light sources may be quasi-monochromatic light sources. Any of the light sources and illumination subsystem configurations described herein may be included in a metrology tool having any suitable configuration. Therefore, many different combinations of light sources and metrology tool configurations are possible and may be selected depending on, for example, the wafer and/or wafer characteristics that are to be measured by the tool.

The illumination subsystem may be configured in a number of different ways for selective illumination angle and/or polarization. For example, the illumination angle may be altered or selected by changing a position of a light source of the illumination subsystem or by controlling one or more other elements of the illumination subsystem that affect the illumination angle. The illumination angle that is altered or selected may be the polar angle and/or the azimuthal angle of the incident light. In addition, the illumination polarization may be selected by selecting a light source that emits light having the selected polarization or by including one or more polarization selection/alteration/filtering elements in the path of the light emitted by the tight source.

The metrology tool also includes a detection subsystem configured to detect light from the wafer. As shown in FIG. 3, the detection subsystem includes objective 308 configured to collect light from wafer 310. The collected light may include specularly reflected light and/or scattered light. The detection subsystem may also include beamsplitter 306 configured to transmit the light collected by the objective lens.

In some cases, the detection subsystem includes beamsplitter 312 positioned in the path of the light transmitted by beamsplitter 306 and configured to transmit light having one or more wavelengths and reflect light having one or more other wavelengths. The detection subsystem may also include one or more bandpass filters 314 that may be configured as described further herein and may transmit light having one or more selected wavelengths. One or more of beamsplitter 306, beamsplitter 312, and bandpass filter(s) 314 may be configured to selectively transmit light having one or more selected wavelengths and to reflect or otherwise block light that does not have the one or more selected wavelengths out of the detection path of the detection subsystem such that they are not detected by detector 316.

The detection subsystem may also include one or more bandpass filters 318 and detector 320. In the configuration shown in FIG. 3, light reflected by beamsplitter 312 is directed to one or more bandpass titters 318, and light transmitted by the one or more bandpass filters is detected by detector 320. Bandpass filter(s) 318 and detector 320 may be further configured as described herein. Beamsplitter 312 may be configured to transmit light having one or more first wavelengths and to reflect light having one or more second wavelengths different than the first wavelength(s). In this manner, detectors 316 and 320 may detect light having different wavelengths.

In one embodiment, the illumination and detection subsystems include a common objective lens and a common dichroic mirror or beamsplitter, which are configured to direct the light from a light source of the illumination subsystem to the wafer and to direct the light from the wafer to a detector of the detection subsystem. For example, as shown in FIG. 3, the illumination and detection subsystems may both include objective 308 making it a common objective lens and beamsplitter 306 making it a common dichroic mirror or beamsplitter. As described above, objective 308 and beamsplitter 306 are configured to direct the light from light source 302 of the illumination subsystem to wafer 310 and to direct the light from the wafer to detector 316 and/or detector 320 of the detection subsystem.

In one embodiment, one or more wavelengths of the light detected by the detection subsystem are selected by altering one or more parameters of the detection subsystem based on one or more materials on the wafer, one or more characteristics of the wafer that are being measured, or some combination thereof. Therefore, like the illumination wavelength range, the detection wavelength range can be adjusted depending on the wafer materials and the wafer characteristic(s) being measured. The wavelength(s) detected by the detection subsystem may be altered as described herein (e.g., using bandpass filter(s)) or in any other suitable manner known in the art.

In one embodiment, the detection subsystem includes two or more channels configured to separately and simultaneously detect the light from the wafer in different wavelength ranges. For example, the metrology tool can be configured to include multiple parallel imaging channels that image varying wavelength ranges through suitable selection of dichroic and bandpass filter components. In the embodiment shown in FIG. 3, one of the channels may include bandpass filter(s) 314 and detector 316 and the other of the channels may include bandpass filter(s) 318 and detector 320. In addition, the metrology tool may include more than two channels (e.g., by insertion of one or more additional beamsplitters (not shown) into the path of the light from the wafer, each of which may be coupled to a detector (not shown) and possibly spectral filters (not shown) and/or other optical elements (not shown)). The channel including bandpass filters(s) 314 and detector 316 may be configured to detect light in a first wavelength band, and the channel that includes bandpass filter(s) 318 and detector 320 may be configured to detect light in a second wavelength band. In this manner, different wavelength ranges of light may be detected by different channels simultaneously. In addition, the different wavelength ranges may be mutually exclusive (e.g., separated by one or more wavelengths) or may overlap entirely (e.g., one wavelength range may be entirely within another wavelength range) or partially (e.g., multiple wavelength ranges may include the same one or more wavelengths, but at least some of the wavelengths in a first wavelength range are mutually exclusive of at least some of the wavelengths in a second wavelength range, and vice versa). In some embodiments, the detection subsystem includes a spectrometer configured to measure a characteristic of the light from the wafer across a wavelength range. For example, in the embodiment shown in FIG. 3, one or more of detectors 316 and 320 may be a spectrometer.

As described above, the detection subsystem may be configured to selectively and separately detect the light from the wafer based on the wavelength of the light. In a similar manner, if the illumination subsystem is configured for selective illumination angle and/or polarization, the detection subsystem may be configured for selective detection of light based on angle from the wafer (or collection angle) and/or polarization. For example, the detection subsystem may include one or more apertures ((not shown) that can be used to control the collection angles of the light detected by the detection subsystem. In another example, the detection subsystem may include one or more polarizing components (not shown) in the path of the light from the wafer that can be used to control the polarizations of the light detected by the detection subsystem.

The metrology tool also includes a computer subsystem configured to generate metrology data for the wafer using output generated by the detection subsystem responsive to the detected light. For example, in the embodiment shown in FIG. 3, the metrology tool may include computer subsystem 322, which may be coupled to detectors 316 and 320 by one or more transmission media shown in FIG. 3 by the dashed lines, which may include "wired" and/or "wireless" transmission media, such that the computer subsystem can receive output generated by the detectors of the detection subsystem that is responsive to the detected light. One output of the detectors may include, for example, signals, images, data, image data, and the like. For example, the detector(s) may be imaging detectors that are configured to capture image(s) of the wafer. The computer subsystem may be further configured as described herein. The metrology data may be any of the metrology data described herein. The metrology data may be stored in (or output as) a metrology results file.

It is noted that FIG. 3 is provided herein to generally illustrate some configurations of the metrology tool embodiments described herein. Obviously, the metrology tool configurations described herein may be altered to optimize the performance of the metrology tool as is normally performed when designing a commercial metrology tool.

In addition, the metrology tools described herein may include an existing metrology tool (e,g., by adding functionality described herein to an existing metrology tool) such as Archer, ATL, SpectraShape, SpectraFilm, Aleris, Wafer-Sight, Therma-Probe, RS-200, CIRCL, and Profiler tools that are commercially available from KLA-Tencor. For some such systems, the methods described herein may be provided as optional functionality of the existing metrology tool (e.g., in addition to other functionality of the existing tool). Alternatively, the metrology tool described herein may be designed "from scratch" to provide a completely new system.

Although the metrology tool shown in FIG. 3 is a light-based or optical tool, it is to be understood that the metrology tool may be configured to also or alternatively use a different type of energy to perform the measurements described herein. For example, the metrology tool may be an electron beam-based tool such as a scanning electron microscope (SEM) or a transmission electron microscope (TEM) and/or a charged particle beam-based tool such as a focused ion beam (FIB) tool. Such metrology tools may include any suitable commercially available metrology tool.

As described above, the metrology data is generated for the wafer by a metrology tool that performs measurements on the wafer at an array of measurement points on the wafer. The array of measurement points may be a regular array of measurement points, but that is not necessary for the embodiments described herein. In addition, the array of measurement points may be a two-dimensional array of measurement points on the wafer.

A density of the measurement points on the wafer, which may be determined as described further herein, may be used to determine the exact locations of the measurement points on the wafer. For example, based on the selected or predetermined density of the measurement points on the wafer, the measurement points can be evenly or regularly spaced across the wafer such that the measurement points have the selected or desired density across the wafer.

In one embodiment, the metrology tool generates the metrology data for the wafer prior to inspection of the wafer. In another embodiment, the measurement points are determined prior to inspection of the wafer and independently of defects detected on the wafer. Generating the metrology data (and optionally acquiring it) before inspection of the wafer can be advantageous for a number of reasons. For instance, as described further herein, if the metrology data is generated prior to defect detection, the metrology data can be used before inspection of the wafer, e.g., to generate care areas that are used during inspection of the wafer. Even if the metrology data is not used before or during the inspection (and is instead used after the defects have been detected on the wafer and/or scanning of the wafer is completed), the metrology data may still be generated prior to any scanning, defect detection, or inspection of the wafer layer on which the measurements were performed. In addition, if the metrology data is generated prior to inspection of the wafer as described herein, then the measurement points must be determined independently of the detected defects because the defects have not been detected on the wafer prior to the measurements and are therefore not available for use in determining where the measurement points are to be located.

As described further herein, the exact locations of the measurement points may be different than the exact locations of the defects detected on the wafer and may be determined based on the desired density of the measurement points on the wafer, which will in general be different than the density of the defects on the wafer. For example, the measurement points may be arranged in an array (e.g., a two-dimensional array) on the wafer, and the density of the points in the array may be determined as described further herein. In contrast, defects may be detected on the wafer at a much higher density and frequency than the measurement points on the wafer. Furthermore, the measurement point locations may be determined independently of the defects detected on the wafer because the purpose of the measurements is not necessarily to measure one or more characteristics of defects on the wafer but to measure variations in one or more characteristics of the wafer, which may include one or more materials on the wafer and/or one or more patterned structures on the wafer.

In some contexts, the one or more characteristics of the wafer may be considered defects. For example, one linkage between the metrology and inspection domains is that defects may occur during wafer processing if the characteristic(s) reach sufficiently large deviations from specifications. In the embodiments described herein, the characteristic(s) of the wafer are purposefully being measured regardless of whether the variations render the characteristic(s) defective, If a defect happens to be present at one of the preselected measurement points, it may actually affect the metrology data generated at that measurement point. However, such measurements (of defects or characteristic(s) that render the wafer defective) are not the goal of the measurements described herein.

In one embodiment, at least some values of the metrology data generated by the metrology tool are below a resolution limit of an inspection tool that performs inspection of the wafer. For instance, the metrology tool may be configured to have a higher resolution than the inspection tool, including optical inspection tools as well as electron beam inspection tools. Therefore, the inspection tool will have a resolution that is lower than the metrology tools described herein that will be used to perform the measurements described herein. In this manner, the inspection tools are configured such that the output generated by these inspection subsystems cannot be used to determine such variations.

In some embodiments, a density of the measurement points on the wafer is less than a density of inspection points on the wafer at which output is generated by a detector of an inspection tool during inspection of the wafer. Metrology as that term is used herein is performed independently of inspection and typically with lower frequency. For example, in general, the measurement points will be spaced much farther apart from each other than the inspection points are spaced from each other. In particular, in most inspections that are performed on wafers, inspection points generally overlap with one another (as the light, electrons, etc. are scanned across the wafer) so that no portion of the area to be inspected on the wafer does not undergo inspection. Such overlap of the inspection points is therefore by design. Therefore, the density of the inspection points is so high that the inspection points overlap with each other at least a little bit. In contrast, it is desirable to select or determine the density of the measurement points to be as low as possible (for throughput and cost considerations) while still being sufficiently responsive to the variations of interest (described further herein) in the measurements. For example, the desired measurements (e.g., wafer topology, film thickness, CD, etc.) are performed at measurement points on the wafer that are dense enough to allow reliable prediction (e.g., interpolation, extrapolation, etc.) of the measurements to any point on the wafer.

As used herein, the term "point" as in "measurement point" or "inspection point" does not necessarily mean that the measurement or inspection is a "point" measurement or inspection. In other words, as used herein, the term "point" is meant to indicate a location or area at which a measurement is performed or inspection output is acquired. The measurement or inspection that is performed at any one "point" may however be performed across a relatively small area on the wafer (e.g., a spot or area on the wafer). In this manner, a "measurement point" as used herein is meant to indicate a location or area on a wafer at which a measurement is performed by a metrology tool, and each of the "measurement points" are discrete from one another on the wafer. In addition, an "inspection point" as used herein is meant to indicate an area on a wafer at which inspection output is generated by an inspection tool, but not each of the "inspection points" are necessarily discrete or spaced from each other because they will in general overlap with one another as inspection is normally performed.

Different minimum "densities" of measurement points may be used for different use cases. For example, film thickness tends to vary relatively slowly across wafers so the density of film thickness measurements could be relatively low. On PWQ wafers, certain CD measurements can be performed per modulation to get more reliable measurements. Therefore, a density of the measurement points that is "dense enough" for the embodiments described herein includes any density of measurement points that is large enough to make the prediction of the metrology data to the non-measured wafer locations sufficiently accurate.

The metrology data can be determined or generated from the measurements performed at the measurement points in any suitable manner. In other words, many different methods, algorithms, models, functions, etc. are available in the art to determine the metrology data from the measurements. The metrology data used in the embodiments described herein may be generated in any of these known ways. In addition, metrology analysis (e.g., modeling of overlay and other metrology data) may be performed on the 5D Analyzer system, which is commercially available from KLA-Tencor. This system is established in the industry and contains capabilities for advanced metrology analysis. Metrology data can be delivered from this system or directly from the metrology tool if no further modeling is required.

In one embodiment, the metrology data includes one or more of film thickness, patterned structure profile, CD, line edge roughness (LER), line width roughness (LWR), and overlay measurements. For example, the wafer characteristic(s) that may be particularly useful in embodiments described herein include targeted CD measurements such as line width, line roughness (CD uniformity) in particular structures, overlay measurements, and any other such characteristic(s) that can affect the distances between geometric primitives on the wafer. In other words, the metrology data described herein can include any and all measurements and/or wafer characteristic(s) that have an effect on the distances between geometric primitives. LER and LWR and methods for measuring and determining these characteristics are described in Chapter 2 of "Variation-Aware Advanced CMOS Devices and SRAM" by Shin, Springer Netherlands, 2016, pp. 19-35, which is incorporated by reference as if fully set forth herein. The measurements described herein may also be performed as described in commonly assigned U.S. Patent Application Publication No. 2016/0116420 by Duffy et al. published Apr. 28, 2018, which is incorporated by reference as if fully set forth herein. The embodiments described herein may be further configured as described in these references.

In another embodiment, the metrology data includes one or more of lithography focus metrology and scanner leveling data. In an additional embodiment, the metrology data includes measurements of a characteristic of the wafer known to correlate with patterning defects. For example, focus error on a scanner (i.e., the tool used to print a pattern on a wafer) may be of concern because such focus error can lead to patterning defects on the wafer. Therefore, the metrology data may include any measurements of the wafer that relate to the lithography focus known in the art. In addition, the scanner leveling data may be acquired from the scanner itself or from measurements performed while the wafer is positioned in the scanner or while the scanner is otherwise printing the pattern on the wafer. The scanner leveling data may be generated and/or acquired in any suitable manner known in the art. Furthermore, the measurements of the characteristic of the wafer known to correlate with patterning defects may include some of the metrology data described above such as film thickness, which can cause patterning defects. Other examples of such measurements may include, but are not limited to, flatness of the wafer (which may be characterized by variations in film thickness across the wafer and/or variation in the position of the uppermost surface of the wafer relative to the scanner caused by, for example, warping of the wafer), variation in refractive index (or indices) of one or more materials on the wafer during the printing of the pattern on the wafer, relative or absolute locations of patterned features underlying the layer in which the patterned features are being printed, and the like. These measurements may be performed in any suitable manner known in the art.

In one embodiment, the metrology tool is not included in the system. For example, the metrology tool may be included in one system that is different and separate from the system embodiments described herein. In other words, the metrology tool may be included in a system that is physically separate from the embodiments described herein and may not share any common elements with the system embodiments described herein. In particular, as shown in FIGS. 1 and 3, the inspection subsystem may be included in one system, the metrology tool may be configured as another system, and the system and metrology tool are completely physically separate from each other and share no common hardware elements.

In such embodiments, the one or more computer subsystems described herein may be configured to access and acquire the metrology data from a computer subsystem coupled to the metrology tool and/or a storage medium in which the metrology data has been stored by the metrology tool. The one or more computer subsystems may acquire the metrology data from another computer system or subsystem or a storage medium as described further herein. In this manner, the metrology toot and the system that includes the one or more computer subsystems described herein may be different tools. The metrology data can be stored in a database (such as Klarity, commercially available from KLA-Tencor), from where the measurements can be retrieved by the embodiments described herein.

In this manner, acquiring the metrology data does not necessarily include generating the metrology data. For example, as described above, the metrology tool may be configured to generate the metrology data and then a computer subsystem described herein may acquire the metrology data from the metrology toot, a computer subsystem of the metrology tool, or a storage medium in which the metrology data has been stored. As such, the metrology data that is acquired may have been generated by a system other than the embodiments described herein. However, in some embodiments, acquiring the metrology data includes generating the metrology data. For example, the embodiments described herein may include a metrology tool (as described further herein), and therefore the system embodiments described herein may be configured for generating the metrology data by performing the measurements on the wafer at the measurement points. Alternatively, the system embodiments (or one or more elements of the system) described herein may be configured to cause the metrology toot to perform the measurements on the wafer. Therefore, acquiring the metrology data may include performing the measurements on the wafer at the measurement points.

Figure 4:
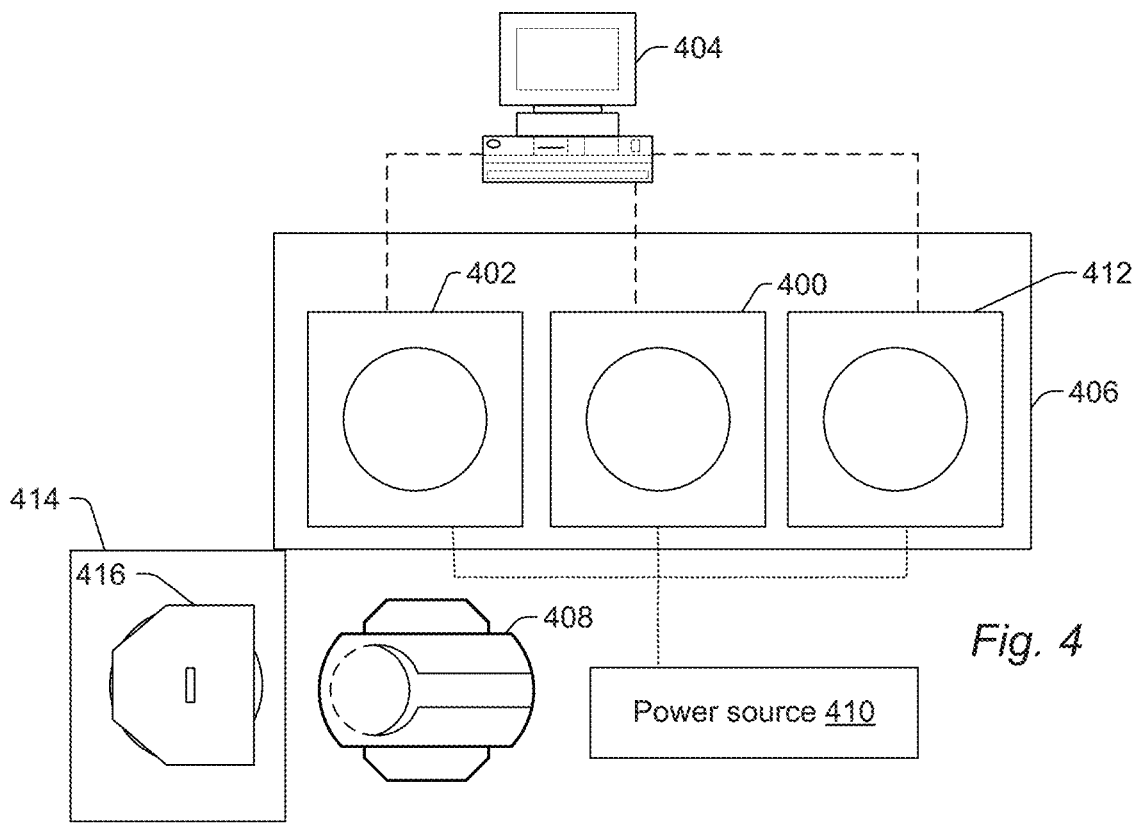
FIG. 4 is a schematic diagram illustrating a plan view of an embodiment of a system configured as described herein.

In one embodiment, the metrology tool is incorporated into the system such that the inspection tool and the metrology tool share one or more common elements of the system. FIG. 4 illustrates one embodiment of such a system. The system includes inspection tool module 400 and metrology tool module 402. The inspection tool included in module 400 may be configured as described herein with respect to FIGS. 1 and 2. The metrology tool included in module 402 may be configured as described herein with respect to FIG. 3. The system may also include computer subsystem 404 coupled to one or both of the inspection tool and the metrology tool. Computer subsystem 404 may be configured according to any other embodiments described herein.

In some embodiments, the system also includes additional module 412, and the additional module may be configured to perform one or more additional processes on the wafer. The one or more additional processes may include, for example, defect review, defect repair, and/or any other quality-control related processes.

The one or more common elements that may be shared by the metrology and the inspection tools may include one or more of common housing 406, common wafer handler 408, common power source 410, computer subsystem 404, or some combination thereof. The common housing may have any suitable configuration known in the art. For example, an original housing of the system may simply be expanded to accommodate both the metrology and inspection tools. In this manner, the metrology and inspection tools may be configured as a single unit or tool. The common wafer handler may include any suitable mechanical and/or robotic assembly known in the art. The common wafer handler may be configured to move the wafer between the metrology and inspection tools in such a way that a wafer can be moved from the metrology tool directly into the inspection tool without having to put the wafer back into its cassette or other container between the processes. The common power source may include any suitable power source known in the art. The computer subsystem may be coupled to the metrology and inspection tools as described further herein such that the computer subsystem can interact with the metrology and inspection tools as described further herein. The additional module may be incorporated into the system in the same manner described above.

The hardware of the metrology tool may be disposed in a measurement chamber, that is separate from the inspection tool and additional module included in the system. The measurement chamber may be disposed laterally or vertically proximate the inspection tool and the additional module. For example, the system may be configured as a cluster of modules that may each be configured to perform different processes. In addition, the measurement chamber, the inspection tool, and the additional module may be disposed laterally or vertically proximate load chamber 414 of the system. The load chamber may be configured to support multiple wafers (or a lot) such as cassette 416 of wafers that are to be processed in the system. Wafer handler 408 may be configured to remove a wafer from the load chamber prior to measurement and/or inspection and to place a measured and/or inspected wafer into the load chamber. Furthermore, the measurement chamber may be disposed in other locations proximate the inspection subsystem such as anywhere where there is sufficient space for the metrology tool hardware and anywhere a wafer handler may fit such that a wafer may be moved between the measurement chamber and the inspection tool. In this manner, wafer handler 408, a stage (not shown), or another suitable mechanical device may be configured to move a wafer to and from the metrology and inspection tools of the system.

The one or more computer subsystem(s) may be configured for determining positions of the at least two locations on the wafer with respect to locations of the measurement points on the wafer. Determining positions of the at least two locations on the wafer with respect to the locations of the measurement points may include coordinate system matching. In other words, for the correct overlay of metrology and other data, the coordinate system and layout can be matched between the different data. The parameters that may be matched may include die size, die center location (0,0 die), reticle (exposure field) sizes, and die/reticle origin. In order to test a potential correct match of coordinate systems, a specific measurement point that has been measured by the metrology tool can be imaged on the output acquisition subsystem so that an x, y location reported by the output acquisition subsystem can be compared, correlated, and/or matched to the x, y location used in the metrology tool.

As described above, therefore, determining positions of the at least two locations on the wafer with respect to the measurement point locations may include some kind of coordinate matching. That matching can be performed in a number of different ways. For example, one or more common reference points on a wafer that are measured or detected can be identified and used to determine one or more offsets between the different coordinates used and/or reported in. Those one or more offsets can then be used to translate any one reported location from one coordinate system to another. Once the locations under consideration have been translated to the metrology coordinates or the measurement point locations have been translated to the wafer location coordinates, the locations under consideration with respect to the measurement point locations may be determined.

These relative locations may be determined in any suitable manner. For example, after coordinate system matching or translating, the at least two locations that are the same as (or substantially the same as) the measurement point locations may be identified. These at least two locations may include any wafer locations that at least partially overlap with the locations of the measurement points and/or only the wafer locations that are located entirely within a measurement point location. In addition, after coordinate system matching or translation, the locations under consideration that are not substantially the same as any of the measurement point locations may be identified (which may include most of the wafer locations). In some instances, the at least two locations with respect to the measurement point locations may be determined simply in the common coordinate system generated by coordinate system matching or translation. However, determining the at least two locations with respect to the measurement point locations may also or alternatively include determining an offset or distance between each of the at least two locations and the location(s) of the one or more closest measurement points in the common coordinate system generated by coordinate system matching or translation. Determining the positions of the at least two locations with respect to the location(s) of the measurement points may therefore also include determining which of the measurement point(s) is/are closest to the at least two locations, and that information may also be stored with the corresponding wafer locations. In general, therefore, different methods can be used in the embodiments described herein to determine the relative locations between the at least two locations and the measurement point locations in a common coordinate system.

The assigning includes, for the at least two locations having the positions at the locations of the measurement points, assigning the acquired metrology data generated at the locations of the measurement points to the at least two locations based on which of the measurement points at which the at least two locations are positioned. For example, as described further above, determining the at least two locations with respect to the measurement point locations may include determining if any of the at least two locations overlap or are the same as the measurement point locations in the same coordinate system. If any of the measurement point locations overlaps or is the same as one of the at least two locations, then the metrology tool has effectively performed a measurement at the one location although that was not by design. In any case, since a measurement has effectively been performed for the at least two locations having positions that are the same as or overlap with a measurement point location, the metrology data generated at the measurement point locations may be assigned to those locations. In this manner, if one of the at least two locations is positioned at a first of the measurement points, the one location may be assigned the metrology data generated at the first of the measurement points; if another of the at least two locations is positioned at a second of the measurement points, the other location may be assigned the metrology data generated at the second of the measurement points; and so on.

The assigning also includes, for the at least two locations having the positions spaced from the locations of the measurement points, predicting the metrology data at the at least two locations from the metrology data generated at the measurement points and the positions of the at least two locations determined with respect to the locations of the measurement points. For example, the metrology data generated at the measurement points may be used to predict the metrology data at the at least two locations using one of the methods described herein. Since a significant portion of the at least two locations will typically not have the same positions as the measurement points on the wafer, the predicting will be an important step in making the embodiments described herein work properly.

In one embodiment, the predicting includes interpolation of the acquired metrology data from the measurement points to the positions of the at least two locations determined with respect to the locations of the measurement points. Interpolation can be generally defined in the art as the prediction of values within a given data range. The interpolation used in the predicting step may include any suitable interpolation method known in the art. Examples of suitable interpolation methods include, but are not limited to, linear interpolation, polynomial interpolation, spline interpolation, non-linear interpolation, interpolation via a Gaussian process, multivariate interpolation, bilinear interpolation, and bicubic interpolation, all of which may be performed in any suitable manner known in the art.

In another embodiment, the predicting includes extrapolation of the acquired metrology data from the measurement points to the positions of the at least two locations determined with respect to the locations of the measurement points. Extrapolation can be generally defined in the art as the prediction of data outside of a given data range. For a metrology to wafer location correlation, precise metrology data for all wafer locations on a wafer is preferable. Since the metrology measurements will not be performed at all wafer locations (e.g., due to the time and expense involved in making the metrology measurements), the metrology data can be extrapolated to the wafer locations. The accuracy of the extrapolation depends on the density of the metrology measurements on the wafer and the model that is used for the extrapolation. The model that is used for extrapolation depends on the metrology use case (CD, film, overlay, etc.). There are different methods that can be used for extrapolation.

One such extrapolation method is contour plot based extrapolation. For example, once the metrology data has been acquired, a contour plot for the data can be generated in any suitable manner known in the art. Once a contour plot is available, a value of a wafer characteristic in the metrology data can be extracted for each point on the wafer in a user-defined grid size. This metrology value can then be applied to wafer locations within that same grid. In this manner, metrology values can be assigned to each wafer location according to the value of the grid in which the wafer location is located.

Another such extrapolation method is modeled based extrapolation, which may be particularly useful for overlay metrology data. Based on the initial overlay measurements, a model can be generated in the 5D Analyzer. The correct use of the model can be determined based on the sampling plan of the measurements and a model for the exposure tool used to print the design on the wafer. Based on an available model, the data can be exported for a user-defined number of measurement points across the wafer. The 5D Analyzer can populate any defined point on the wafer with the modeled data from the actual measurements to get a relatively large number of modeled overlay data across the wafer. This data can then be used like any other metrology data for the X and Y directions. The contour plot methodology described above can be applied for every wafer location.

For the modeled based methodology, the calculated model terms can be exported to the one or more computer subsystems. If the values for each model term and each wafer measured as well as the model are exported to the one or more computer subsystems, the computer subsystem(s) can then calculate the overlay value for every location on the wafer. This method would reduce the required data transfer between the metrology tool (or the 5D analyzer) and the one or more computer subsystems and would allow the determination of the precise modeled overlay results for each wafer location rather than an approximation with a grid as described above. Although the modeled based approach has been described above as being used for overlay data, this approach can be used for any other metrology data described herein because the 5D Analyzer has the capability to model any metrology data.

For the one of the locations on the wafer, selecting the SBG rule also includes determining MC scores for SBG rules associated with the geometric primitives in the FOV based on the determined distances between the geometric primitives. In this manner, the method includes modulating SBG complexities with design metrics and metrology measurements. Modulating SBG complexities with design metrics and metrology measurements is important for a number of reasons. For example, different locations in a design having the same SBG geometric primitives may have different as-designed distances between the geometric primitives. In other words, first and second primitives in one location in a design spaced apart by a first dimension may also be found in another location in the design spaced apart by a second dimension different than the first. These local design dimensions (and the differences between them at different locations in the design) can be measured or determined directly from the design intent Files. Different instances of the same SBG geometric primitives may also have different characteristics on the wafer (at the same location in multiple instances of the design (multiple dies or fields) printed on the wafer and/or at multiple instances of the same SBG geometric primitives in a single instance of the design (a die or field) printed on the wafer). For example, the process with which the patterned features are formed on the wafer (e.g., lithography, etch, a combination thereof, other process(es), etc.) may cause the dimensions and other characteristics (e.g., spatial relation of one feature relative to another, overlay, etc.) to vary from the as-designed dimensions and other characteristics. In one such example, a width of a space between two lines on a wafer can increase from its as-designed width if the widths of the lines on either side of the space are smaller than their as-designed widths. In another such example, a width of a space on a wafer can increase from its as-designed width if the overlay shifts between two patterns on either side of the space change (the two patterns may be formed on the same layer of the wafer in a multi-patterning process or the two patterns may be formed on different layers of the wafer in multiple patterning processes). Therefore, such changes in the geometric primitives including the distances between them due to the processes performed on the wafer (or the wafer itself) cannot be estimated or determined from the design for the wafer. However, such changes in the geometric primitives can be estimated or determined (e.g., via interpolation) by the embodiments described herein.

The embodiments described herein address several issues with currently used methods and systems for SBG. For example, there are certain drawbacks to SBG rules as they are currently specified which are addressed by the embodiments described herein. One example of such a drawback is that while the pattern in a defect location and the surrounding patterns that influence defect formation at the location can be restricted by the sizes of short- and long-range windows, respectively, there is no further refinement of the criticality at a location induced by a rule because currently used SBG methods and systems do not consider the actual distances between the various geometric primitives specifying that rule. Another example of such a drawback is that SBG rules are based on identifying the existence of primitives, not their count. This blindness to counts also translates to rules, e.g., if the same rule hits multiple times at a crosshair location, due to the presence of multiple primitives of the same type, then SBG at present does not record these multiple hits, An additional example of such a drawback is that a similar although technically easier situation arises in the case of different rules hitting at the same crosshair location.

Define the spatially modulated complexity function (smcf) $C_R(X, Y)$ of rule $R \in R$ (where rule R is an element of a set of rules R) at design point (x, y) only if rule $R \in R$ hits location (x, y); otherwise, it is 0. The value of the smcf $C_R(x, y)$ point (x, y) is based on the distance of the relevant, primitives in rule R from the crosshair position at that point. These relevant primitives are the attacking primitives described further herein. Note that multiple versions of the same rule can now hit the same (x,y) location, and because the values of their smcfs are different, it can lead to a high value of criticality at (x, y) equal to the maximum value of the smcfs.

As described further herein, we formulate the general principles that will allow defining the smcf for every rule. These general principles will allow creating smcfs not only for all SBG rules (see, for example, U.S. Patent Application Publication No. 2017/0186151 published Jun. 29, 2017 by Baneijee et al., which is incorporated by reference as if fully set forth herein), but also any SBG rule that could be defined in the future. As also described further herein, we use the concept of the smcf of an SBG rule to provide a definition for its MC. The embodiments described herein may be further configured as described in the above-referenced patent application publication.

Figure 5:
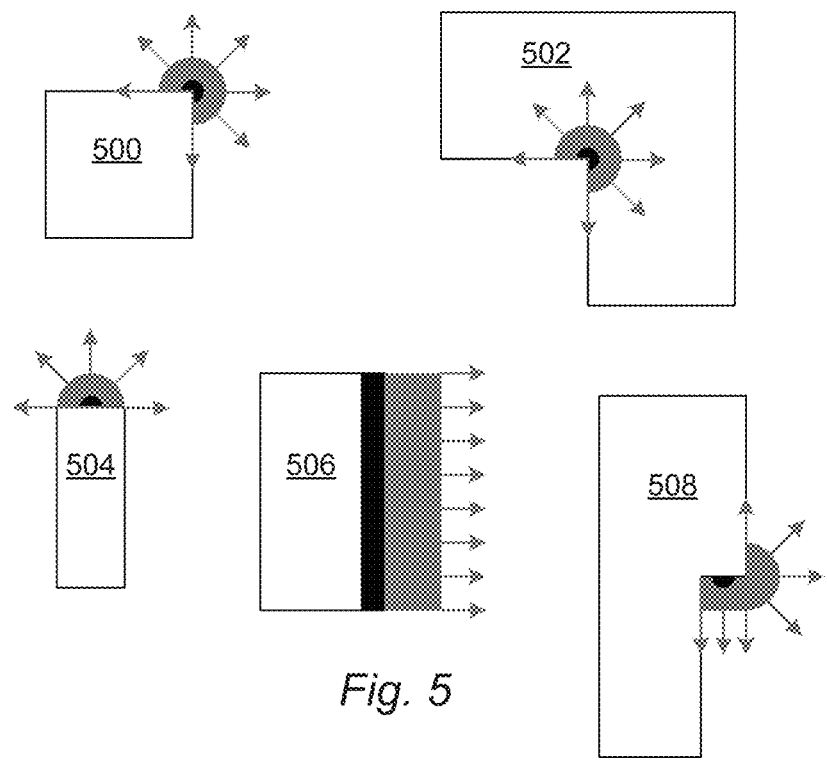
FIG. 5 is a schematic diagram illustrating a plan view of examples of geometric primitives and directional force fields emanating from and surrounding them.

When considering the directional force fields (DFFs) of geometric primitives, imagine DFFs emanating from and surrounding geometric primitives as the cause of a defect at the crosshair center of a defect location. For convex and concave corner primitives, the influence region of these fields together with their associated directions are shown in FIG. 5 as examples 500 and 502, respectively. The geometric primitives are indicated in this figure by the solid black areas, and the influence regions of their DFFs with their associated directions are indicated by the gray shaded areas and arrows, respectively, in this figure. Note the implosive nature of a concavity in example 502 (i.e., the influence region is directed into the patterned feature). Example 504 in FIG. 5 shows the influence region of the DFF associated with the line end (i.e., line tip) primitive. Example 506 in FIG. 5 shows the influence region of the DFF associated with a line (i.e., edge) primitive. Note that while we have used black dots in defining rules for line primitives in the above referenced patent application publication, the actual primitive is a line segment as displayed in black in example 506. The dot paradigm helps specify a rule by defining the proper primitives in each quadrant—this is not required here.

Although it is not used in the current set of SBG rules, the jog primitive is deemed to be an important geometric primitive and may be used in the SBG rules herein and in the future. For sake of completeness, the influence region of the DFF associated with a jog primitive is shown in example 508 in FIG. 5.

An SBG rule is specified by first fixing a point (x, y) in design space where a defect is formed and/or where a wafer location for which the steps described herein are being performed. The point (x, y) is the center of the crosshair around which quadrants bounded by influence ranges are formed, and the co-occurrence of the geometric primitives in these quadrants specify a SBG rule. As defined herein, an attacking primitive in an SBG rule is a geometric primitive in the influence ranges of that SBG rule that has a component of its DFF pointing to the center of the crosshair of that SBG rule, The importance of an attacking primitive in a spatially modulated SBG rule lies in its distance with respect to the crosshair center in the formulation of the smcf for a rule.

The SBG rules are formulated so that the defect causing influences are either along the horizontal or vertical directions, or both. Whether a rule configuration has horizontal or vertical directions depends upon which of those directions gives higher criticality. As defined herein, the direction of highest criticality of a rule configuration is called the canonical direction of that rule configuration. From an observation of the SBG rules as described in the above-referenced patent application publication, the canonical directionality of a rule for a given configuration is easily determined. The Dihedral Group D8 (where a Dihedral Group is a group of symmetries of an n-sided polygon in abstract algebra) acting on the directions of geometric primitives allows each of the SBG rules to be evaluated invariant to the D8 transformations. More importantly for the current situation, it allows one to determine in a precipitation state, the canonical direction of every D8 configuration of each rule.

The smcf $C_R(x, y)$ can be defined as follows. Place a crosshair at location (x, y). This corresponds to the crosshair center of the rule R around which its influence windows are defined. It marks the putative defect location or wafer location under consideration. Determine the canonical direction of the configuration of rule R. Let $d_1, \ldots, d_N$ be the non-negative distances of the N attacking primitives $\pi_1, \ldots, \pi_N$ for rule R configuration from the crosshair along its canonical direction (horizontal or vertical). Then the smcf $C_R(x, y)$ is defined as:

$$C_R(x, y) \stackrel{def}{=} \frac{a_1}{\left(\frac{d_1}{D_1}\right)^{k_1}} + \frac{a_2}{\left(\frac{d_2}{D_2}\right)^{k_2}} + \ldots + \frac{a_N}{\left(\frac{d_N}{D_N}\right)^{k_N}}$$

where $D_i$ is the nominal design distance corresponding to distance $d_i$ as described further herein. The indices $k_i$ are defined as: $k_i$ is defined as being equal to 1 if $\pi_i$ is a line primitive and $k_i$ is defined as being equal to 2 if $\pi_i$ is a point primitive. The complexity coefficients $a_i > 0$ are constants calculated from the user defined complexities for a set of SBG rules.

Most importantly, the right-hand side of the above equation has the following desirable properties. Any decrease in the distances $d_i$ will increase the value of the smcf $C_R(x, y)$. Everything else being the same, the value of the smcf $C_R(x, y)$ for a "sub-rule" R' of R at location (z, y) will be lower than $C_R(x, y)$.

The following concern arises from an inspection of the above equation: at what location (x, y) of the crosshair (along its canonical direction) is the value of complexity of the rule equal to the user defined complexity? If such a location is not specified, then the user provided complexity value C[R] for rule R is of no value because the spatially-modulated complexity value in the above equation is independent of it. To address this issue, we first prescribe a nominal state $R_0$ of rule R that includes specifying the nominal design-dictated configurations for R and specifying the normalizing position of the crosshair for R. Once a nominal state $R_0$ of rule R is prescribed, it will be used to determine the nominal design distance $D_i$ corresponding to distance $d_i$ of the $i^{th}$ attacking primitive $\pi_i$ of R.

Figure 6:
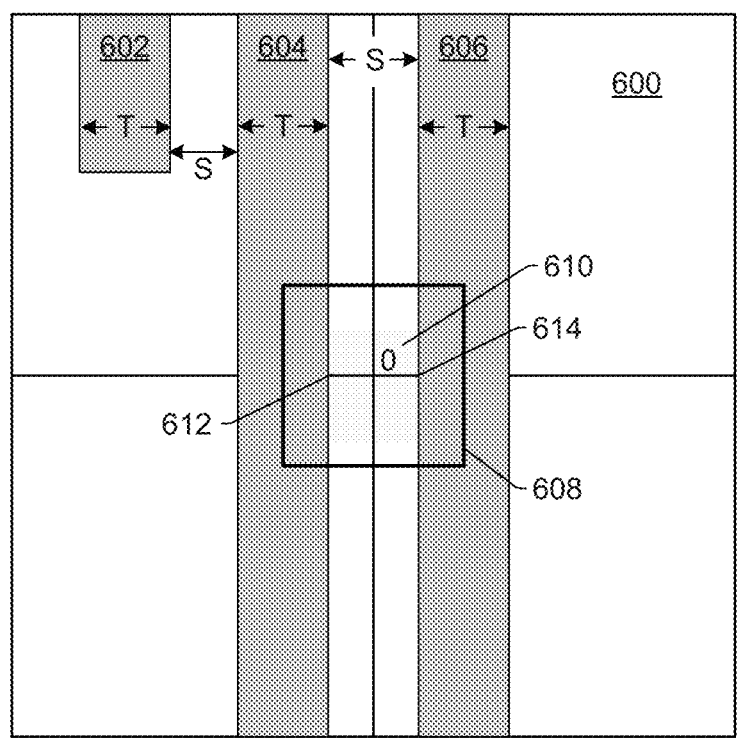
FIG. 6 is a schematic diagram illustrating a plan view of one embodiment of a nominal configuration of a shape based grouping rule.

For any design, the nominal minimum patterned feature (e.g., space and trace) dimensions are specified. These dimensions are used to create the nominal long-range and short-range influence window sizes as described in the above-referenced patent application publication. They can also be used to create the nominal design-dictated configuration for a rule. For example, if S and T represent the minimum space and trace dimensions, respectively, then the nominal configuration for SBG V5 Rule 16 is shown in FIG. 6, where the widths of the thin lines 602, 604, and 606 are all T, and the spaces between them all have widths S. Long-range influence window 600 and short-range influence window 608 have sizes determined as described in the above-referenced patent application publication. The long and short range windows may be centered on origin 0 that is the mid-point of a hit-line segment that has starting point 612 and end point 614 and that is in hit range 610, whose area is shown by the light gray shaded area in FIG. 6.

Next, the normalizing position of the crosshair of a rule is also prescribed such that the nominal distance $D_i$ corresponding to distance $d_i$ of the attacking primitive $\pi_i$ from the crosshair can be calculated and applied to the above-equation. Observe that rule hits occur at contiguous locations on a line segment called a hit line segment along the canonical direction of a rule, as the crosshair moves from the start to the end point along that direction. In FIG. 6, for example, a hit line segment and its start and end points 612 and 614, respectively, for SBG V5 Rule 16 are shown. Note that depending on the long-range and short-range window sizes, the same rule is hit at a continuum of contiguous hit line segments orthogonal to the canonical direction—the hit range—hit range 610 shown in FIG. 6. As defined herein, the normalizing position of the crosshair for a rule is defined to be midway between the start and end positions of a hit line segment for that rule, Given space and trace dimensions S and T, the nominal design-dictated configuration for a configuration of rule R and the normalizing position of its crosshair can be determined—this constitutes the nominal state of rule R. The nominal state of rule R is used to find the nominal design distance $D_i$ corresponding to distance $d_i$ of the $i^{th}$ attacking primitive $\pi_i$ of R.

Once the nominal state $R_0$ of a rule R has been determined as described above, the issue of incorporating the user-defined complexity can be resolved. As described herein, the complexity of a rule R at its nominal state $R_0$ at the normalizing position of its crosshair is the user defined complexity $C_R$ of rule R. Since at the normalizing crosshair position of the nominal state $R_0$ of rule R, the distances $d_i$ are equal to their corresponding nominal design distances $D_i$, combining this definition with the above equation yields: $C_R = a_1 + a_2 + \ldots + a_N$. Given a set of SBG rules, with a user-defined complexity associated with each rule, one can determine the (best possible) values of the complexity coefficients $a_i$.

The MC score of an SBG rule can be defined based on the above considerations and guided by the following observations. For a spatial distribution of geometric primitives that trigger a rule, a single criticality value should suffice—having a contiguous set of values as given by its smcf for every location (x, y) would make it difficult to return a single score for the inspection or review sampling use cases. The smcf values at the extreme points of a hit line segment may be infinitely large because the distance to one of the attacking primitives could be 0. This phenomenon leads to even further inconvenience. As defined herein, the MC score of a rule R on a hit line segment is the value of its smcf at the normalizing position of its crosshair on the hit line segment. Therefore, although any SBG rule can have a distribution of MC scores determined for it, the embodiments described herein may report and use a single MC score for any SBG rule.

For the one of the locations on the wafer, selecting the SBG rule further includes selecting one of the SBG rules for the one location based on the MC scores. In one embodiment, selecting one of the SBG rules includes identifying one of the SBG rules having a maximum of the MC scores as a most possible SBG rule for the one location and selecting the most possible SBG rule for the one location. The phrase "most possible" has a strict mathematical definition akin to "most probable." For example, for each location on the wafer for which the steps described herein are performed, a rule hit list may be generated that includes one or more rules that "hit" at that location. For each rule in the hit list, an MC score can be determined as described herein. The most possible rule for a location can then be determined as the SBG rule that has the maximum of the MC scores determined for each rule in the hit list for that location.

The basis for complexity as used herein therefore corresponds to a possibility measure of complexity, where the complexity of the union is the maximum of its constituents. This contrasts with the competing probabilistic measure of complexity where the complexity of the union is the sum of its disjoint constituents. The possibility measure of complexity is more convenient for the embodiments described herein than the probabilistic measure for a number of reasons. For example, the possibility measure of complexity is the natural formulation of the workings of criticality, e.g., the most complex rule "wins." In another example, the additive probability theoretic measure must compute the intersecting (aka common) primitives and subtract off the complexity of that configuration, which introduces a further level of complication and consequently computations. These complications are exacerbated when multiple hits beyond two are considered especially compared to the computations described herein. In an additional example, it is far easier for humans to understand and debug the maximum measure results. In contrast, the additive measure results are often difficult to comprehend because the effects of multiple hits and their intersections are inextricably confounded.

The one or more computer subsystems are also configured for sorting the at least two locations on the wafer based on the SBG rules selected for the at least two locations. The sorting of the locations may vary depending on the application for which the steps of the embodiments are performed. For example, in one embodiment, the sorting includes separating the at least two locations into groups such that the SBG rule selected for each of the locations in one of the groups are the same. In this manner, the sorting may include grouping locations by the SBG rules selected for the locations (such that locations for which the same SBG rule is selected are in the same group and locations for which different SBG rules are selected are in different groups). The sorting may also or alternatively include prioritizing the locations based on the SBG rules selected for the locations. Prioritizing the locations may include assigning a higher priority to locations for which an SBG rule having a higher MC score was selected versus other locations assigned an SBG rule having a lower MC score. If the sorting includes the grouping as described above, the groups may be prioritized in a similar manner. Results of the sorting may be used for one or more other steps described herein.

In one embodiment, the at least two locations on the wafer include locations of defects detected on the wafer by inspection, and the sorting includes sampling the defects detected at the least two locations based on the SBG rules selected for the at least two locations. In this manner, the embodiments described herein may be used for review (or other) sampling using metrical SBG. The locations of the defects detected on the wafer by inspection may be determined or acquired as described herein (e.g., by or from an inspection tool). The defects may be sampled based on the SBG rules selected for the defect locations in a number of different ways. For example, in one embodiment, the at least two locations on the wafer include locations of defects detected on the wafer by inspection, and the sorting includes prioritizing the defects for defect review based on the SBG rules selected for the at least two locations. One advantage of the embodiments described herein is better prioritization of review samples.

In such an embodiment, the sampling may include comparing the MC scores of the SBG rules selected for the locations of the defects and selecting the defects having the highest. MC scores before other defects having lower MC scores. In one such example, the defects may be sampled in descending order of the MC scores of their SBG rules. If defect locations are sorted into groups based on their SBG rules, sampling the defects may include determining different sampling schemes for different groups (e.g., sample number, percentage of group population, etc.) such that some groups (e.g., those assigned SBG rules having higher MC scores) are sampled more heavily than other groups (e.g., those assigned SBG rules having lower MC scores), such that each group is sampled at the same rate, number, frequency, etc., such that defects having the most diverse characteristics in one or more of the groups are selected, such that defects are randomly selected from one or more of the groups, or in any other appropriate manner.

Figure 7:
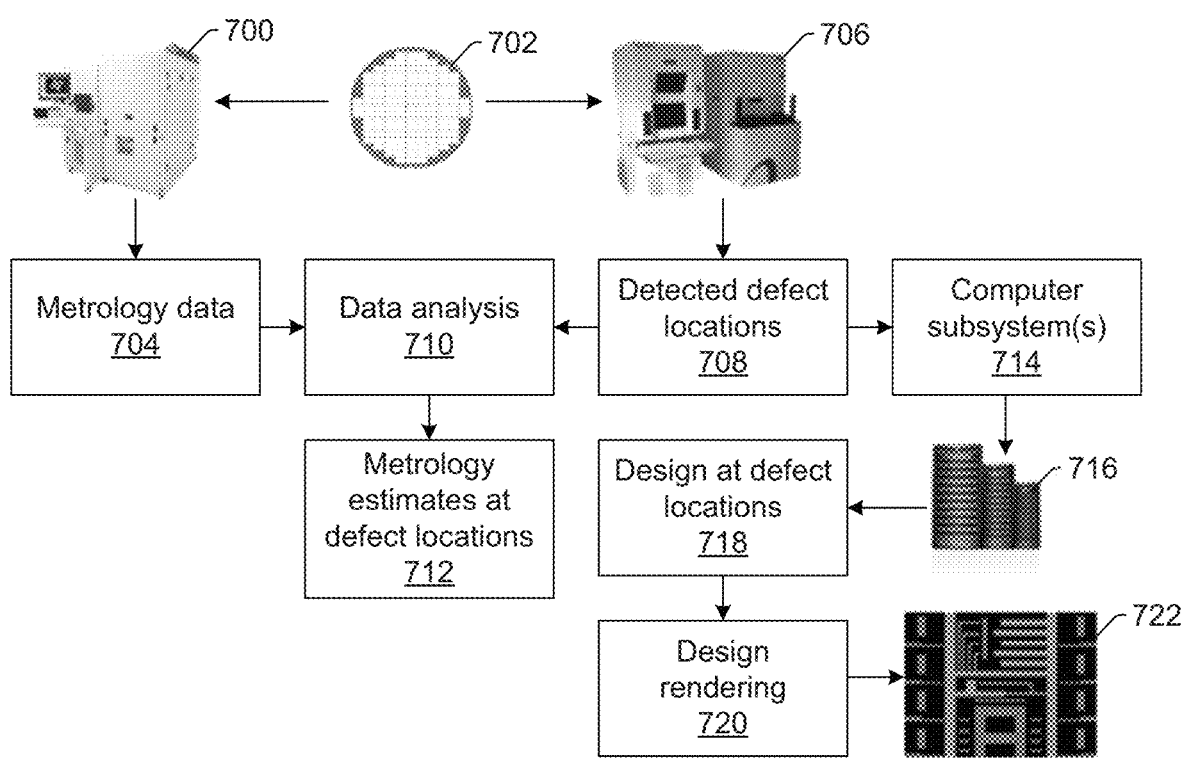
FIGS. 7-9 are flow diagrams illustrating various embodiments of steps that may be performed by the embodiments described herein.

One embodiment of an initial flow of review sampling performed with metrical SBG is shown in FIG. 7. The wafers that are sent for inspection may be a subset of the wafers on which metrology measurements have been performed at specific measurement points, and these metrology measurements have been recorded and can be accessed by wafer ID. Alternatively, metrology measurements have been performed on at least some wafers in the lot of wafers to be inspected. The metrology measurements may be performed as described further herein to thereby generate any of the metrology data described herein. These measurements and the estimated parameters of the process and metrology tools that they have gone through are then used to estimate the metrology data on the wafers that are sent for inspection. For example, estimating the metrology data may include predicting metrology data at wafer locations at which the measurements have not been performed, which may be performed as described further herein.

All these details have been shown at a high level in FIG. 7 where wafer 702 (e.g., a multi-patterned wafer) is shown to be sent to both metrology tool 700 and inspection tool 706. Metrology tool 700 may include any of the metrology tools described herein, including CD and overlay tools. Inspection tool 706 may include any of the inspection tools described herein, including a BBP inspection tool.

The metrology tool generates metrology data 704 (e.g., CD and/or overlay measurements) at specific target sites on the wafer. A CD measurement tool may provide measurements on the local morphologies of patterned features such as traces, and an overlay measurement tool may provide the rigid affine transformation between multiple patterns and/or layers. The inspection tool generates detected defect locations 708 on the wafer(s). Metrology data 704 and detected defect locations 708 are fed to data analysis 710, which may be performed by an interpolation module on the 5D Analyzer to provide metrology estimates at defect locations 712 (e.g., CD and overlay estimates at the defect locations).

Given the list of detected defect locations 708, computer subsystem(s) 714, which may include any of the computer subsystem(s) described herein and/or a Main UI, can request the design database, e.g., which may be stored on design based binning (DBB) server 716, to output all of the design polygons intersecting a field of view (FOV) of specified physical dimensions, e,g., 2 um or 4 um, centered at every defect location (or two or more defect locations). The DBB server outputs design at defect locations 718, which may include a set of design text tiles, one for each defect location (or two or more defect locations) with the design information, e.g., multi-pattern related information. In this manner, the DBB server may output substantially small, discrete portions of the design, one corresponding to each of the defect locations under consideration. The DBB server may have any suitable configuration known in the art. The design information may also be acquired from any of the design data described herein and/or by any of the computer subsystem(s) or tools (e.g., an EDA tool) described herein.

Design rendering 720 may use the design at defect locations 718 to render (at a user-defined pixel size) image 722 showing all the design polygons in the specified FOV with every polygon in the same pattern being colored the same and polygons in different patterns being colored differently. In other words, the rendered images may include some indicia (e.g., color) to indicate patterns that are formed on the wafer in different lithography steps. Design rendering may be performed in any suitable manner known in the art. The design rendering generates images that illustrate the design intent (meaning the design data as it was intended to be formed on the wafer rather than as it will be formed on the wafer or imaged by a tool such as an inspection tool). In this manner, rendered images 722 provide the design information portion of the data (e.g., geometric primitives information) on which the SBG rules operate. Thus, at the end of the initial flow shown in FIG. 7, there are two pieces of information, metrology estimates 712 and rendered images 722 at every defect location under consideration.

In one such embodiment, the sampling is performed by inputting the SBG rules selected for the at least two locations into a learning based model. For example, the sampling can be performed by a machine learning based algorithm, trained on metrical SBG features like MC scores, that uses these features to create the sample. One advantage of the embodiments described herein is better features for machine learning based sampling.

The computer subsystem(s), e.g., computer subsystem 36 and/or computer subsystem(s) 102, may be configured to execute one or more components (not shown) that include a learning based model. The learning based model may be configured as a deep learning model. Generally speaking, "deep learning" (also known as deep structured learning, hierarchical learning or deep machine learning) is a branch of machine learning based on a set of algorithms that attempt to model high level abstractions in data. In a simple case, there may be two sets of neurons: ones that receive an input signal and ones that send an output signal. When the input layer receives an input, it passes on a modified version of the input to the next layer. In a deep learning based model, there are many layers between the input and output (and the layers are not made of neurons but it can help to think of it that way), allowing the algorithm to use multiple processing layers, composed of multiple linear and non-linear transformations.

Deep learning is part of a broader family of machine learning methods based on learning representations of data. An observation (e.g., an image) can be represented in many ways such as a vector of intensity values per pixel, or in a more abstract way as a set of edges, regions of particular shape, etc. Some representations are better than others at simplifying the learning task (e.g., face recognition or facial expression recognition). One of the promises of deep learning is replacing handcrafted features with efficient algorithms for unsupervised or semi-supervised feature learning and hierarchical feature extraction.

Machine learning can be generally defined as a type of artificial intelligence (AI) that provides computers with the ability to learn without being explicitly programmed. Machine learning focuses on the development of computer programs that can teach themselves to grow and change when exposed to new data. In other words, machine learning can be defined as the subfield of computer science that "gives computers the ability to learn without being explicitly programmed," Machine learning explores the study and construction of algorithms that can learn from and make predictions on data—such algorithms overcome following strictly static program instructions by making data driven predictions or decisions, through building a model from sample inputs.

The machine learning described herein may be further performed as described in "Introduction to Statistical Machine Learning," by Sugiyama, Morgan Kaufmann, 2016, 534 pages; "Discriminative, Generative, and Imitative Learning," Jehara, MIT Thesis, 2002, 212 pages; and "Principles of Data Mining (Adaptive Computation and Machine Learning)," Hand et aL, MIT Press, 2001, 578 pages; which are incorporated by reference as if fully set forth herein. The embodiments described herein may be further configured as described in these references.

Figure 8:
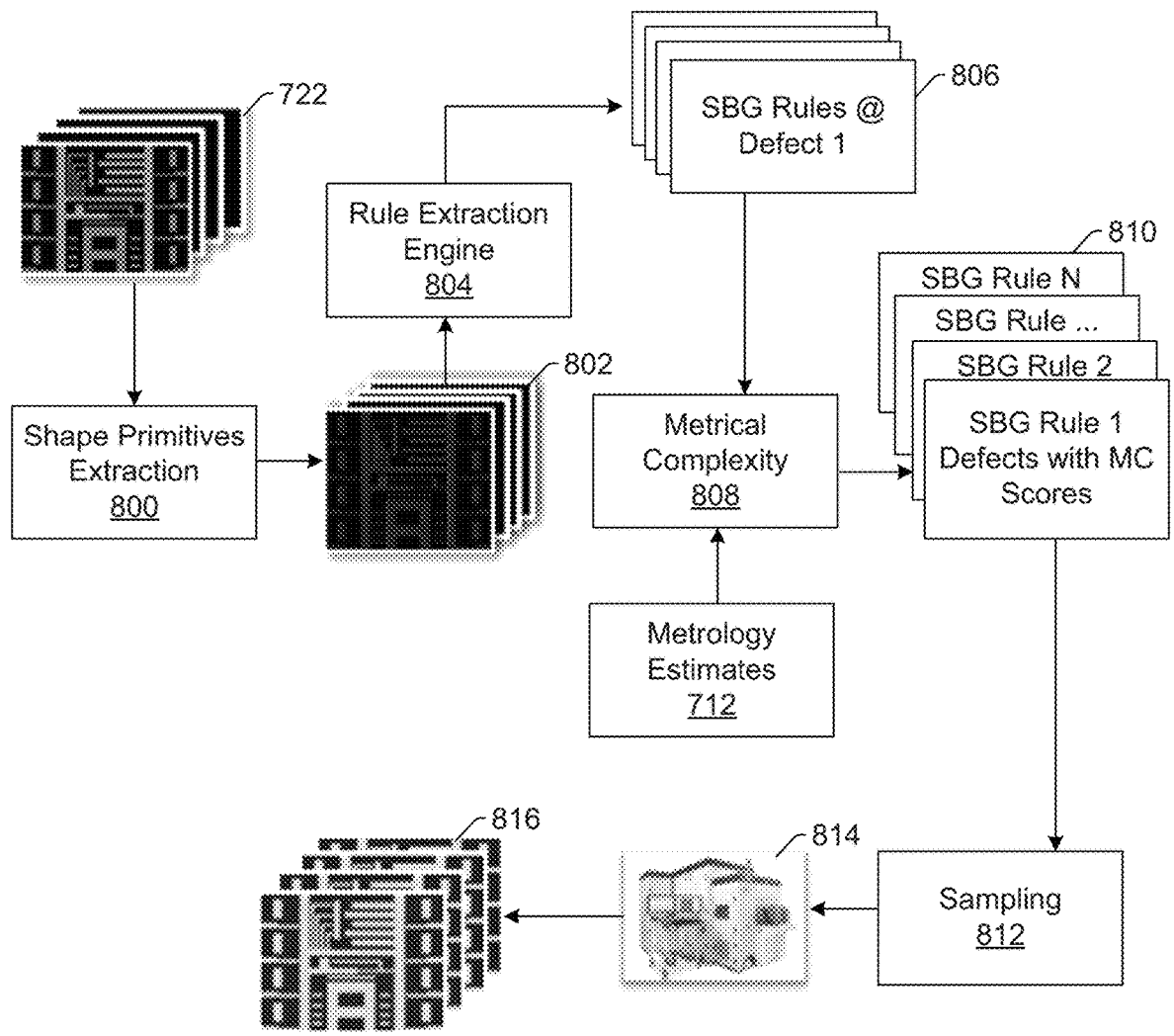

One embodiment of a final flow, a continuation of the flow shown in FIG. 7, of the review sampling performed with metrical SBG is shown in FIG. 8. It starts with the two pieces of information generated in the initial flow—metrology estimates 712 and rendered images 722 at every defect location under consideration, and generates the MC scores for every defect location under consideration.

Rendered images 722 are input in FIG. 8 to shape primitives extraction 800 that processes the rendered images to generate output 802, the set of SBG primitives at every defect location FOV. Passing each one of these primitive images through SBG rule extraction engine 804 produces rule hit list 806 that records all the rules hit at every defect location being considered.

Given rule hit list 806 and primitive image list 802, the Metrical Complexity scorer 808 computes the various distances in the design intent between the various geometric primitives involved in calculating the MC scores for each rule hit at every defect location under consideration. Furthermore, using the corresponding metrology estimate list 712, the Metrical Complexity scorer 808 determines the shifts of these geometric primitives in order to refine the distances between the primitives at every defect location. This step may be performed as described further herein. This refinement provides more accurate MC scores for each rule hit than the ones obtained from design intent only. Finally, the Metrical Complexity scorer 808 computes the MC scores for each rule hit at every defect location under consideration and the most possible rule hit with the maximum MC score at every defect location under consideration, and outputs this information in list 810. These steps may be performed as described further herein.

The MC scores along with the rule information in list 810 is then used by sampling 812 to create a prioritized sample of defect locations, e.g., sorted in descending priority order for review. This sampling could be performed with an out-of-the-box algorithm that uses the information in list 810, especially the MC scores, to create the prioritized sample, much like the round-robin scheme described in U.S. Patent Application Publication No. 2019/0072858 by Saraswatula et al. published Mar. 7, 2019, which is incorporated by reference as if fully set forth herein. The embodiments described herein may be further configured as described in this patent application. The sampling can also be performed with a machine learning based algorithm, trained on metrical SBG features like MC scores, and using these features to create the prioritized sample. This sample is then subsequently sent to tool 814, which may be a SEM review tool or any other suitable defect review tool, that visits and captures high resolution images 816, e.g., SEM images, at the defect locations specified in the sample. The sample of defect locations may also be used by one or more other tools for one or more other processes (e.g., metrology, defect repair, etc.).

In some embodiments, the at least two locations include SBG rule hit locations, and the one or more computer subsystems are configured for identifying the SBG rule hit locations by searching the design for the wafer for geometric primitives associated with one or more of the SBG rules. This step may be performed as part of a micro care area (MCA) generation use case for metrical SBG.

Figure 9:
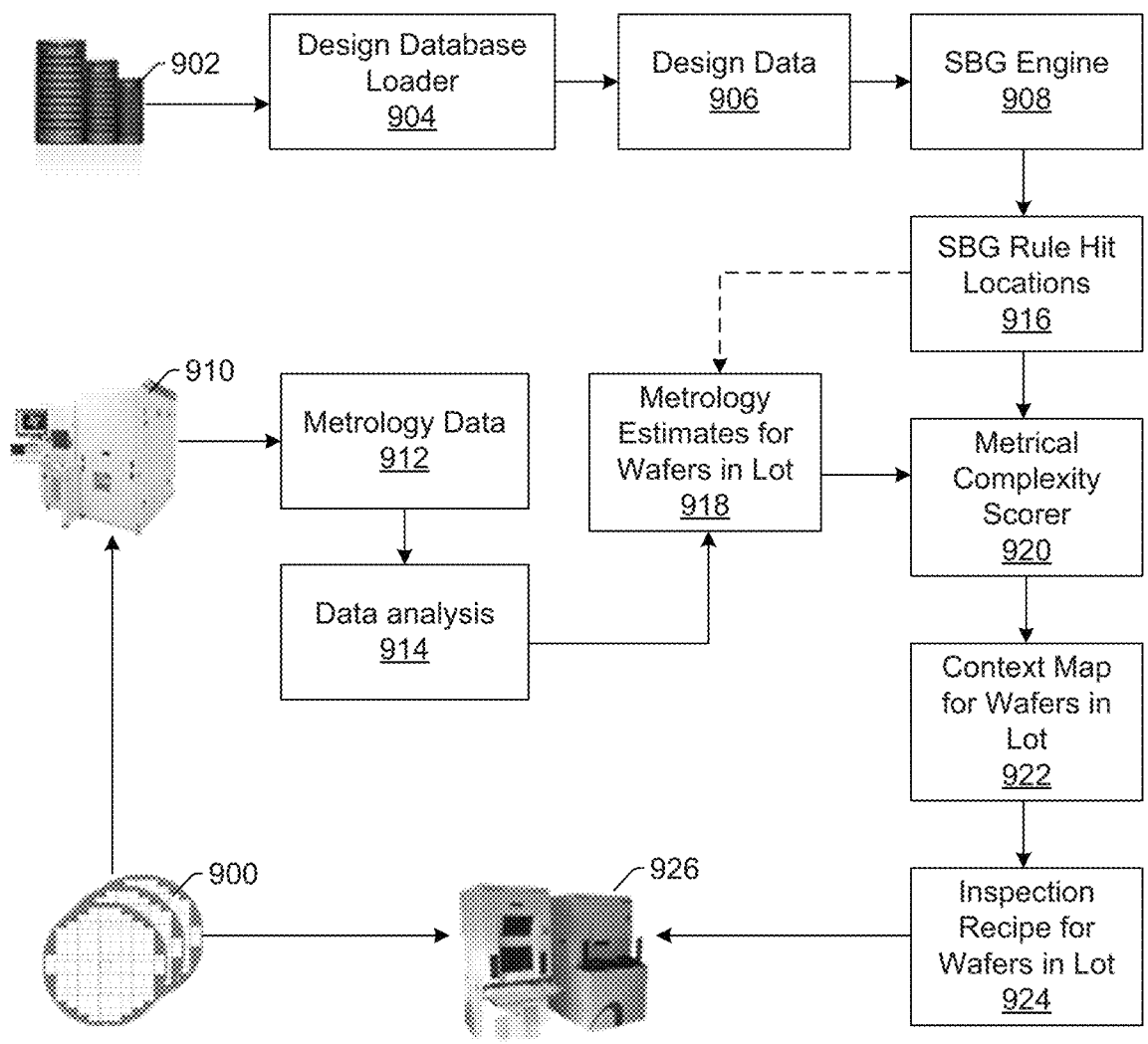

FIG. 9 depicts one embodiment of steps that may be performed by the embodiments described herein for MCA generation using metrical SBG. In this case, the design data for wafer lot 900 residing in server 902 is loaded by design database loader 904 into design data 906, which may have any suitable format known in the art such as the RDF design data format, a proprietary design data format available commercially from KLA-Tencor, or any other format that protects both the design user and design owner from sensitive information leakages. The design data is then operated on by SBG engine 908 that extracts shape primitives using shape primitives extraction 800 shown in FIG. 8, finds locations where each rule is triggered using rule extraction engine 804 in FIG. 8, and generates SBG rule hit locations 916. This design analysis procedure can be a one-time setup step on any design intent data and may be performed as described further herein.

Metrology measurements on wafer lot 900 are carried out by metrology tool 910, e.g., a CD and/or overlay metrology tool. The metrology tool generates metrology data 912, e.g., CD and/or overlay measurements, at specific measurement points on a sample (one or more) of wafers in lot 900. If the metrology tool is a CD metrology tool, the metrology tool may provide measurements on the local morphologies of traces or other patterned features on the wafer sample. If the metrology tool is an overlay metrology tool, the metrology tool may provide the rigid affine transformations between multiple patterns and/or layers on the wafer sample. These results are fed into data analysis 914, which may be an interpolation algorithm module in the 5D Analyzer, to provide metrology estimates for wafers in lot 918, which may include CD and/or overlay estimates for every location under consideration on the wafers in lot 900. Alternatively, metrology estimates 918 can be determined at only SBG rule hit locations 916 triggered by the SBG engine 908, this dependency being shown in FIG. 9 by the dotted light joining 916 to 918. Hit locations 916 and metrology estimates 918 are fed into Metrical Complexity Scorer 920, which generates the MC scores and the most possible rule triggered at all (or at least some of) hit locations 916 on each wafer in lot 900. These steps may be performed as described further herein.

In one embodiment, the one or more computer subsystems are configured for generating care areas for the at least two locations based on the SBG rules selected for the at least two locations. As described further herein, "care areas" as they are commonly referred to in the art are areas on a specimen that are of interest for inspection purposes. Sometimes, care areas are used to differentiate between areas on the specimen that are inspected from areas on the specimen that are not inspected in an inspection process. In addition, care areas are sometimes used to differentiate between areas on the specimen that are to be inspected with one or more different parameters. For example, if a first area of a specimen is more critical than a second area on the specimen, the first area may be inspected with a higher sensitivity than the second area so that defects are detected in the first area with a higher sensitivity. Other parameters of an inspection process can be altered from care area to care area in a similar manner. The care areas may also be "micro care areas" in that their dimensions may be substantially small, e.g., on the order of a few (less than 10) pixels.

In some embodiments, a care area or care area information may be generated for each location for which the steps were performed (e.g., every SBG rule hit location). However, in some instances, the results of the embodiments described herein may indicate that a care area is not needed for every SBG rule hit location. For example, in some instances, a cut off may be applied to the MC scores of the SBG rules selected for each of the wafer locations, and care areas may not be generated for locations whose selected SBG rules do not have an MC score above the cut off. Generating care areas for only locations whose selected SBG rules have an MC score above a certain threshold. may be advantageous because even if two locations on the wafer have the same geometric primitives with the same as-designed distances between them, the metrology data for the two locations may be different enough that one of the locations has an MC score that is high enough to warrant a care area while another of the locations has an MC score that is not high enough to justify a care area. Therefore, generating the care areas may include determining, based on the MC scores of the SBG rules selected for different wafer locations, which wafer locations for which care areas will be generated and which wafer locations for which care areas will not be generated.

Generating the care areas may also include determining one or more other parameters with which the care areas are to be processed. For example, generating the care areas may include assigning inspection parameters to care areas for wafer locations for which the selected SBG rules have higher MC scores that result in these care areas being inspected with higher sensitivity than care areas for wafer locations for which the selected SBG rules have lower MC scores. Any other parameter of any process (e.g., a metrology process) may be determined for the care areas in the care area generating step. The results of the care area generating step may be output to a recipe (e.g., an inspection recipe) such that the care areas can be used in the process performed with that recipe. In addition, the care area generating may include generating any other suitable information for the care areas (e.g., location, dimension, care area ID, care area group ID, parameter(s) to be used for different care areas, etc.).

In a further embodiment, the one or more computer subsystems are configured for prioritizing care areas for the at least two locations based on the SBG rules selected for the at least two locations. One advantage of the embodiments described herein is better prioritization of MCAs for inspection. The care areas (or MCAs) can be prioritized as described further herein (e.g., based on the MC scores associated with the SBG rules selected for the care areas).

In another embodiment, the one or more computer subsystems are configured for generating a context map for the wafer in which the SBG rules selected for the at least two locations are associated with the at least two locations, and the system includes an inspection tool configured to perform inspection of the wafer using one or more inspection parameters defined based on the context map. For example, hit locations 916 shown in FIG. 9 on each wafer (or at least one wafer) may be converted to context map 922 for wafers in the lot, and the context map may have a KLA-Tencor proprietary format called a run-time context map (RTCM) or any other suitable format known in the art. The context map can be used to generate (or modify) inspection recipe 924 for wafers in the lot, which can be used by inspector 926 to assign different sensitivities to different regions on the wafer based on the rules triggered (e.g., the SBG rule hit locations), the computed MC scores (e.g., determined by the MC scorer), and the most possible rule identified (the SBG rules selected for the at least two wafer locations). Such an inspection will advantageously be a more hotspot sensitive and less nuisance prone inspection of the wafers in lot 900 (and possibly other lots of wafers of the same type).

The context map may therefore not include care areas generated as described herein. Instead, based on the information included in the context map, the inspection tool can, using the inspection recipe, determine which areas on the wafer are to be inspected and with what parameters. The areas to be inspected and the parameters to be used for the inspection may be determined as described further herein (e.g., based on the MC scores determined for the SBG rules selected for each wafer location for which the steps described herein were performed). While such a context map may be most suitable for use in an inspection process, the context map may also be used for any other process performed on the wafer such as a defect review process, a metrology process, a defect repair process, and the like. The parameters of such processes may be varied based on the context map as described further herein.

An of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. to perform one or more functions for the wafer or another wafer of the same type. Such functions include, but are not limited to, performing a defect review (or other) process on the defects sampled by the computer subsystem(s), reviewing defects on the wafer based on results of prioritizing the defects performed by the computer subsystem(s), inspecting a wafer based on results of generating and/or prioritizing care areas performed by the computer subsystem(s), and performing inspection of a wafer using a context map generated by the computer subsystem(s).

The embodiments described herein can also be combined with the systems and methods described in U.S. Patent Application Publication No. 2019/0067060 by Plihal et al. published Feb. 28, 2019, which is incorporated by reference as if fully set forth herein. The embodiments described herein may be further configured as described in this patent application.

Each of the embodiments of the system may be further configured according to any other embodiment(s) described herein.

Another embodiment relates to a computer-implemented method for shape metric shape based sorting of wafer locations. The method includes the selecting the STSG rules and sorting steps described above.

Each of the steps of the method may be performed as described further herein. The method may also include any other step(s) that can be performed by the output acquisition subsystem, computer subsystem(s), and/or system(s) described herein. The steps of the method are performed by one or more computer subsystems, which may be configured according to any of the embodiments described herein. In addition, the method described above may be performed by any of the system embodiments described herein.

Figure 10:
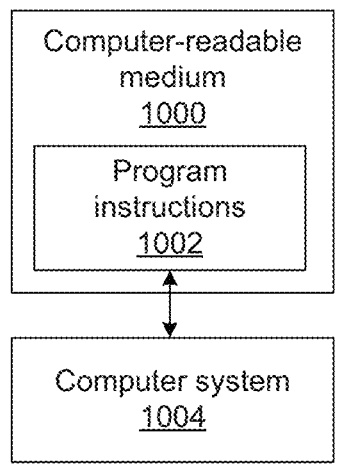
FIG. 10 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for shape metric based sorting of wafer locations. One such embodiment is shown in FIG. 10. In particular, as shown in FIG. 10, non-transitory computer-readable medium 1000 includes program instructions 1002 executable on computer system 1004. The computer-implemented method may include any step(s) of any method(s) described herein.

Program instructions 1002 implementing methods such as those described herein may be stored on computer-readable medium 1000. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, Java-Beans, Microsoft Foundation Classes ("MFC"), SSE (Streaming SIMV Extension) or other technologies or methodologies, as desired.

Computer system 1004 may be configured according to any of the embodiments described herein.

Further modifications and alternative embodiments of various aspects of the invention will be apparent to those skilled in the art in view of this description. For example, methods and systems for shape metric based scoring of wafer locations are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured for shape metric based sorting of wafer locations, comprising:
    one or more computer subsystems configured for:
        selecting shape based grouping rules for at least two locations on a wafer, wherein for one of the locations on the wafer, selecting the shape based grouping rule comprises:
        determining distances between geometric primitives in a field of view centered on the one location by modifying distances between the geometric primitives in a design for the wafer with metrology data for the one location on the wafer;
        determining metrical complexity scores for shape based grouping rules associated with the geometric primitives in the field of view based on the determined distances between the geometric primitives; and
        selecting one of the shape based grouping rules for the one location based on the metrical complexity scores; and
    sorting the at least two locations on the wafer based on the shape based grouping rules selected for the at least two locations.

2. The system of claim 1, wherein said selecting one of the shape based grouping rules comprises identifying one of the shape based grouping rules having a maximum of the metrology complexity scores as a most possible shape based grouping rule for the one location and selecting the most possible shape based grouping rule for the one location.

3. The system of claim 1, wherein the at least two locations on the wafer comprise locations of defects detected on the wafer by inspection.

4. The system of claim 1, wherein the at least two locations on the wafer comprise locations of defects detected on the wafer by inspection, and wherein said sorting comprises sampling the defects detected at the at least two locations based on the shape based grouping rules selected for the at least two locations.

5. The system of claim 4, wherein the sampling is performed by inputting the shape based grouping rules selected for the at least two locations into a learning based model.

6. The system of claim 1, wherein the at least two locations on the wafer comprise locations of defects detected on the wafer by inspection, and wherein said sorting comprises prioritizing the defects for defect review based on the shape based grouping rules selected for the at least two locations.

7. The system of claim 1, wherein the at least two locations comprise shape based grouping rule hit locations.

8. The system of claim 7, wherein the one or more computer subsystems are further configured for identifying the shape based grouping rule hit locations by searching the design for the wafer for geometric primitives associated with one or more of the shape based grouping rules.

9. The system of claim 1, wherein said sorting comprises separating the at least two locations into groups such that the shape based grouping rule selected for each of the locations in one of the groups are the same.

10. The system of claim 1, wherein the one or more computer subsystems are further configured for generating care areas for the at least two locations based on the shape based grouping rules selected for the at least two locations.

11. The system of claim 1, wherein the one or more computer subsystems are further configured for prioritizing care areas for the at least two locations based on the shape based grouping rules selected for the at least two locations.

12. The system of claim 1, wherein the one or more computer subsystems are further configured for generating a context map for the wafer in which the shape based grouping rules selected for the at least two locations are associated with the at least two locations, and wherein the system further comprises an inspection tool configured to perform inspection of the wafer using one or more inspection parameters defined based on the context map.

13. The system of claim 1, wherein the one or more computer subsystems are further configured for acquiring the metrology data for the wafer from a metrology tool that performs measurements on the wafer at an array of measurement points on the wafer and assigning the metrology data to the at least two locations on the wafer based on positions of the at least two locations on the wafer determined with respect to locations of the measurement points on the wafer.

14. The system of claim 13, wherein a density of the measurement points on the wafer is less than a density of inspection points on the wafer at which output is generated by a detector of an inspection tool during inspection of the wafer.

15. The system of claim 13, wherein said assigning comprises:
    for the at least two locations having the positions at the locations of the measurement points, assigning the acquired metrology data generated at the locations of the measurement points to the at least two locations based on which of the measurement points at which the at least two locations are positioned; and
    for the at least two locations having the positions spaced from the locations of the measurement points, predicting the metrology data at the at least two locations from the metrology data generated at the measurement points and the positions of the at least two locations determined with respect to the locations of the measurement points.

16. The system of claim 15, wherein said predicting comprises interpolation of the acquired metrology data from the measurement points to the positions of the at least two locations determined with respect to the locations of the measurement points.

17. The system of claim 15, wherein said predicting comprises extrapolation of the acquired metrology data from the measurement points to the positions of the at least two locations determined with respect to the locations of the measurement points.

18. The system of claim 13, wherein the metrology tool generates the metrology data for the wafer prior to inspection of the wafer.

19. The system of claim 13, wherein the measurement points are determined prior to inspection of the wafer and independently of defects detected on the wafer.

20. The system of claim 13, wherein at least some values of the metrology data generated by the metrology tool are below a resolution limit of an inspection tool that performs inspection of the wafer.

21. The system of claim 13, wherein the metrology data comprises one or more of film thickness, patterned structure profile, critical dimension, line edge roughness, line width roughness, and overlay measurements.

22. The system of claim 13, wherein the metrology data comprises one or more of lithography focus metrology and scanner leveling data.

23. The system of claim 13, wherein the metrology data comprises measurements of a characteristic of the wafer known to correlate with patterning defects.

24. The system of claim 1, further comprising an output acquisition subsystem comprising at least an energy source and a detector, wherein the energy source is configured to generate energy that is directed to the wafer, wherein the detector is configured to detect energy from the wafer and to generate output responsive to the detected energy, and wherein the one or more computer subsystems are further configured to determine information for the at least two locations based on the output.

25. The system of claim 24, wherein the output acquisition subsystem is configured as an inspection subsystem.

26. The system of claim 24, wherein the output acquisition subsystem is configured as a metrology subsystem.

27. The system of claim 24, wherein the output acquisition subsystem is configured as a defect review subsystem.

28. The system of claim 24, wherein the energy directed to the wafer comprises light, and wherein the energy detected from the wafer comprises light.

29. The system of claim 24, wherein the energy directed to the wafer comprises electrons, and wherein the energy detected from the wafer comprises electrons.

30. A non-transitory computer-readable medium, storing program instructions executable on a computer system for performing a computer-implemented method for shape metric based sorting of wafer locations, wherein the computer-implemented method comprises:
  selecting shape based grouping rules for at least two locations on a wafer, wherein for one of the locations on the wafer, selecting the shape based grouping rule comprises:
    determining distances between geometric primitives in a field of view centered on the one location by modifying distances between the geometric primitives in a design for the wafer with metrology data for the one location on the wafer;
    determining metrical complexity scores for shape based grouping rules associated with the geometric primitives in the field of view based on the determined distances between the geometric primitives; and
    selecting one of the shape based grouping rules for the one location based on the metrical complexity scores; and
  sorting the at least two locations on the wafer based on the shape based grouping rules selected for the at least two locations.

31. A computer-implemented method for shape metric based sorting of wafer locations, comprising:
  selecting shape based grouping rules for at least two locations on a wafer, wherein for one of the locations on the wafer, selecting the shape based grouping rule comprises:
    determining distances between geometric primitives in a field of view centered on the one location by modifying distances between the geometric primitives in a design for the wafer with etrology data for the one location on the wafer;
    determining metrical complexity scores for shape based grouping rules associated with the geometric primitives in the field of view based on the determined distances between the geometric primitives; and
    selecting one of the shape based grouping rules for the one location based on the metrical complexity scores; and
  sorting the at least two locations on the wafer based on the shape based grouping rules selected for the at least two locations, wherein selecting the shape based grouping rules and the sorting steps are performed by one or more computer subsystems.

* * * * *

UNITED STATES PATENT AND TRADEMARK OFFICE
CERTIFICATE OF CORRECTION

| | | |
|---|---|---|
| PATENT NO. | : 10,714,366 B2 | Page 1 of 1 |
| APPLICATION NO. | : 16/375851 | |
| DATED | : July 14, 2020 | |
| INVENTOR(S) | : Saibal Banerjee et al. | |

It is certified that error appears in the above-identified patent and that said Letters Patent is hereby corrected as shown below:

In the Claims

Column 40 Line 35, please delete "etrology" and substitute --metrology--.

Signed and Sealed this
First Day of June, 2021

Drew Hirshfeld
*Performing the Functions and Duties of the
Under Secretary of Commerce for Intellectual Property and
Director of the United States Patent and Trademark Office*